(12) United States Patent
Schroeder et al.

(10) Patent No.: US 8,684,114 B2
(45) Date of Patent: Apr. 1, 2014

(54) THERMOELECTRIC DEVICE WITH MAKE-BEFORE-BREAK HIGH FREQUENCY CONVERTER

(75) Inventors: Jon Murray Schroeder, Leander, TX (US); Gerald Phillip Hirsch, Clarksville, TN (US)

(73) Assignee: Jon Murray Schroeder, Cedar Park, TX (US)

( * ) Notice: Subject to any disclaimer, the term of this patent is extended or adjusted under 35 U.S.C. 154(b) by 92 days.

(21) Appl. No.: 13/430,445

(22) Filed: Mar. 26, 2012

(65) Prior Publication Data

US 2012/0247847 A1 Oct. 4, 2012

Related U.S. Application Data

(60) Division of application No. 11/517,882, filed on Sep. 8, 2006, now Pat. No. 8,183,456, which is a continuation-in-part of application No. 10/154,757, filed on May 23, 2002, now abandoned.

(51) Int. Cl.
*B60K 1/00* (2006.01)
*H01L 35/02* (2006.01)

(52) U.S. Cl.
USPC ........... 180/65.1; 136/240; 136/241; 136/242

(58) Field of Classification Search
USPC .............................................. 180/54.1, 65.1
See application file for complete search history.

(56) References Cited

U.S. PATENT DOCUMENTS

| 6,172,427 | B1 * | 1/2001 | Shinohara et al. | 290/40 B |
|---|---|---|---|---|
| 6,605,773 | B2 * | 8/2003 | Kok et al. | 136/242 |
| 6,620,994 | B2 * | 9/2003 | Rossi | 136/201 |
| 6,759,587 | B2 * | 7/2004 | Toshima et al. | 136/236.1 |
| 2002/0046762 | A1 * | 4/2002 | Rossi | 136/201 |
| 2003/0217766 | A1 * | 11/2003 | Schroeder et al. | 136/230 |
| 2007/0033951 | A1 * | 2/2007 | Goenka et al. | 62/3.7 |
| 2008/0223426 | A1 * | 9/2008 | Ohno | 136/238 |
| 2008/0223637 | A1 * | 9/2008 | Bartilson | 180/65.4 |
| 2008/0245590 | A1 * | 10/2008 | Yonak et al. | 180/165 |
| 2009/0272586 | A1 * | 11/2009 | Richter et al. | 180/54.1 |
| 2011/0107773 | A1 * | 5/2011 | Gawthrop | 62/3.61 |
| 2011/0258995 | A1 * | 10/2011 | Limbeck et al. | 60/320 |
| 2013/0160434 | A1 * | 6/2013 | An et al. | 60/320 |

* cited by examiner

*Primary Examiner* — Jeffrey J Restifo
*Assistant Examiner* — Erez Gurari
(74) *Attorney, Agent, or Firm* — Donald E. Schreiber

(57) ABSTRACT

An improved circular multi-element semiconductor thermoelectric hybrid utilizes a make-before-break high frequency switching output component to provide nominal alternating current voltage outputs. Overall efficiency of heat conversion is improved by coupling a chiller to the thermoelectric generator where exhaust heat produces chilled liquid or air that is conveyed to the cold side of the thermoelectric device. The thermoelectric generator is used in a variety of transportation vehicles including manufactured vehicles, retrofitted vehicles and vehicle power combinations.

6 Claims, 19 Drawing Sheets

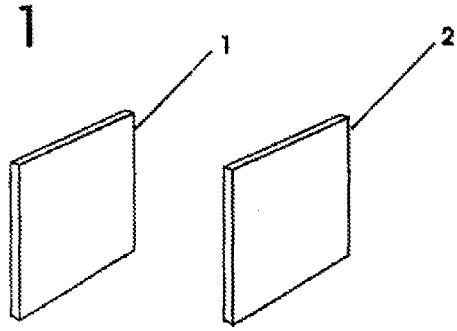
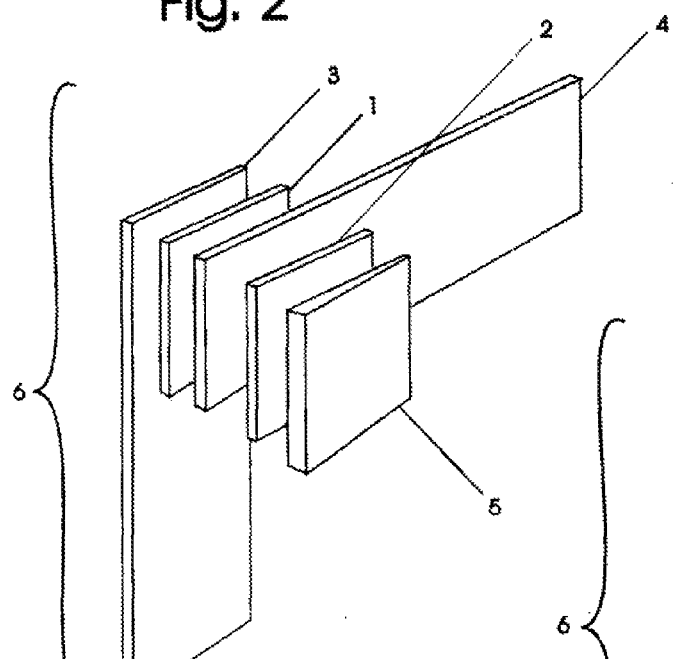
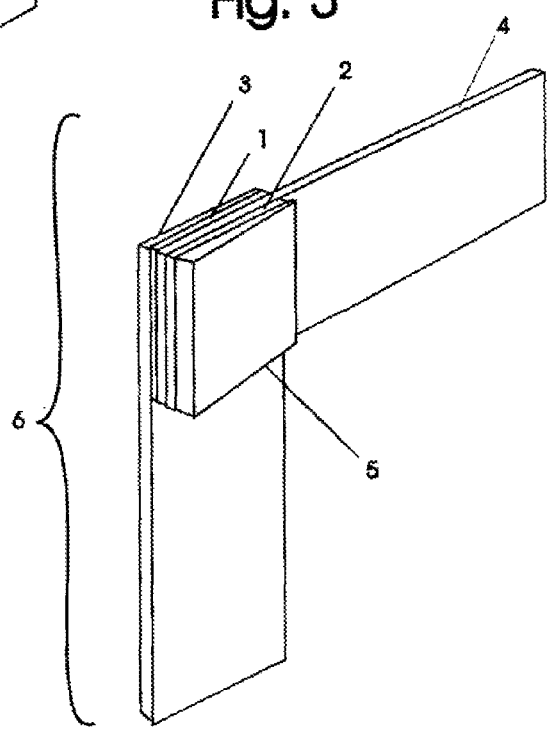

THERMOELECTRIC DEVICE WITH MAKE-BEFORE-BREAK HIGH FREQUENCY CONVERTER

RELATED APPLICATIONS

This application is a division of U.S. patent application Ser. No. 11/517,882 entitled "Thermoelectric Device With Make-Before-Break High Frequency Converter" filed Sep. 8, 2006; which was filed as a continuation-in-part of:
1. then pending U.S. patent application Ser. No. 10/154,757, filed May 23, 2002, entitled "Torus Semiconductor Thermoelectric device" that was published Nov. 27, 2003;
2. then pending U.S. patent application Ser. No. 11/259,922 entitled "Solid State Thermoelectric Power Converter" filed Oct. 28, 2005; and
3. then pending U.S. patent application Ser. No. 11/364,719 entitled "Bismuth-Tellurium and Antimony-Tellurium-Based Thermoelectric Chiller" filed Mar. 1, 2006.

This application also claims priority under 35 U.S.C. §120 from U.S. patent application Ser. No. 13/374,129 entitled "Solid State Thermoelectric Power Converter" that was filed Dec. 13, 2011; which is a division of U.S. patent application Ser. No. 11/259,922 filed Oct. 28, 2005 and entitled "Solid State Thermoelectric Power Converter" that issued Jan. 24, 2012 as U.S. Pat. No. 8,101,846; which was filed as a continuation-in-part of then pending U.S. patent application Ser. No. 10/154,757 entitled "Torus Semiconductor Thermoelectric Device" that was filed May 23, 2002, and published Nov. 27, 2003.

TECHNICAL FIELD

This invention relates to a circular array of semiconductor and conductive elements that comprise a thermoelectric device. Energy generated by a temperature differential between hot and cold fins of the thermoelectric device is more efficiently converted to electrical energy by a high frequency switching component that utilizes make-before-break circuits that maintain current flow in a ring of thermoelectric components. Fuel efficiency is improved by insulating a reflecting cover over the burner unit. Improved energy conversion efficiency is obtained by combining a chiller unit with the thermoelectric device taking the excess heat from the burner to produce cold air or liquid and using the cold air or liquid to cool the cold fins of the thermoelectric device. Conversion of solar energy to electrical energy is improved by storing solar heat and then as needed using the stored heat to generate electricity using the thermoelectric generator. In addition to usual electrical energy uses, energy from the sun or other sources can be used for desalting sea water using a thermoelectric chiller. Efficiency of desalinization is improved by freezing pure water, expelling excess concentrated salt water, then recovering some of the energy of the heat of fusion of ice by reversing the current direction and using the melting ice to cool the hot fins side of the chiller thermoelectric.

BACKGROUND ART

Thermoelectric devices have been used for many years for specific applications where the simplicity of design warrants their use despite a low energy conversion efficiency.

The voltage produced by a thermoelectric device depends on the Seebeck voltage of the dissimilar metals used. Seebeck voltages are higher for some semiconductor materials especially n-type and p-type elements made primarily of mixtures bismuth, tellurium, and antimony.

To compete with more traditional forms of heat to electricity conversion thermoelectric devices must be as efficient as possible. A preferred means to achieve such high efficiency is to arrange the thermoelectric element in a circle with only a very small region used to extract the energy produced by the thermoelectric elements. Patent PCT/US97/07922 to Schroeder discloses such a circular arrangement. Art teaching in this case focused on 3 means to extract energy for the high current in the ring of elements: 1—a vibrating mechanical switch; 2—a Hall effect generator and; 3—a Colpits oscillator. Coatings of hot and cold elements of the thermoelectric device are claimed for selenium, tellurium and antimony among others but not for mixtures of these elements.

U.S. Pat. No. 6,222,242 to Konishi, et al., discloses semiconductor material of the formula $AB_2X_4$ where A is one of or a mixture of Pb, Sn, or Ge, B is one of or a mixture of Bi and Sb and X is one of or a mixture of Te and Se. These represent Pb, Sn or Ge doped bismuth telluride.

U.S. Pat. No. 6,274,802 to Fukuda, describes a sintering method of making semiconductor material whose principle components include bismuth, tellurium and selenium and antimony.

U.S. Pat. No. 6,340,787 to Simeray discloses a thermoelectric component of bismuth doped with antimony and bismuth tellurium doped selenium wherein said component is arranged into a rod. Very low voltages are converted using a self-oscillating circuit.

U.S. Pat. No. 6,172,427 describes the use of a thermoelectric device on the exhaust portion of a combustion-based car using electrically driven wheel wherein excess heat energy is converted to electric power for the vehicle.

It is a purpose if this invention to provide improved efficiency for the conversion of heat energy to electrical energy by making use of n-doped and p-doped semiconductors attached to metal heat-conducting elements in a circular arrangement of thermoelectric components.

It is a further purpose of this invention to provide a high efficiency of transmission of energy contained in a thermoelectric ring to AC current at desired voltages utilizing a make-before-break high frequency switching circuit.

Another purpose of this invention is to improve the efficiency of said thermoelectric device by combining it with a chiller. Excess heat from the thermoelectric is transferred to the chiller where it is converted to cold air or liquid. The cold air or liquid is then transported to the cold fins of the thermoelectric device where by lowering the temperature of the cold fins increases the voltage for a given heating arrangement.

It is also a purpose of this invention to provide an efficient device to convert a variety of heat sources to electricity.

DISCLOSURE OF THE INVENTION

To illustrate this invention figures are drawn to show components of a few implementations of the invention. It should be understood that these figures do not in any way limit this invention as described in the claims.

The invention comprises a heat source, a plurality of thermoelectric coupons arranged in a ring, and a make-before-break high frequency switching means for extracting electrical energy from said ring. Energy is produced in the form of current circling through a plurality of coupons. This current is induced when hot and cold fins of the thermoelectric coupons are respectfully heated or cooled or allowed to cool in the case of cold fins. The term coupon is used herein to identify the combination of a hot fin, a cold fin and constituents attached thereto. Multiple coupons are assembled to make a ring. The ring conformation is important in reducing losses that would otherwise occur if a conductor were used to electrically connect ends of a linear array of coupons.

The heat source can be any of a myriad of combustible materials such as gasses of hydrogen, methane, ethane, propane, butane, etc, liquids such as gasoline, kerosene or crude oil, and solids such as wood, used tires, straw and other biomass materials and coal. In addition the heat needed for electricity production can come from concentrated sunlight. Waste heat from other combustion activities can also be used. For example flue gasses combusted from chemical processing of organic materials can be combusted in a thermoelectric generator providing electrical energy for the processing plant.

For several means used to generate heat, the hot gasses are passed over the hot fins to heat them. In a preferred embodiment gas or liquid is combusted directly under the hot fins. In a preferred configuration the hot fins project inward with regard to a circle or ring of coupons and the hot gas is passed through or combustion occurs adjacent to the hot fins.

In another preferred embodiment the rate of fuel combustion is controlled to match the electrical demand of the thermoelectric device.

In the case of gas or liquid being combusted near the hot fins infrared radiation which passes through or is given off from the hot fins is radiated back on the hot fins by a reflective metallic dome.

In another preferred embodiment the reflective dome is backed by an insulating layer.

In one form of the invention an opening is made in the top reflecting dome to allow hot gas to escape.

A preferred embodiment of the invention is to combine a chiller with the thermoelectric device. Hot gases escaping from the thermoelectric device are conveyed or allowed to move into the chiller. The chiller uses the hot gas to produce cold air or liquid. The cold air or liquid is then directed back to the cold fins of the thermoelectric device. By cooling the cold fins the temperature differential between the hot fins and cold fins is increased producing greater voltage in each coupon and therefore more energy to be extracted from the thermoelectric portion of the combined system.

A unique method is used to extract energy from the high current flowing in the thermoelectric device. An insulator is used to force current into a means for extracting electrical energy. This insulator is place between any two coupons. On each side of the insulator is a conductor which extends outward from the ring of coupons. The conductor is divided in half with one half being wound around the center core of a transformer in one direction and the other half being wound in the opposite direction. To control current flow in one or the other direction MOSfet switches are inserted in the circuit of the primary winding taken from the ring of coupons. The number of switches employed in parallel is determined by the maximum amount of current generated in the ring and depends on the capacity of the MOSfet switches.

In a preferred embodiment a pulse-width modulator chip is used to control the MOSfet switches. If a simple oscillating circuit is used optimum power is not obtained. If the pulse-width modulator is not used very high spikes of current are induced in the primary and secondary. Such spikes would adversely affect electric devices that use the secondary voltage outputs.

Secondary windings in the outer portion of said transformer produce desired output AC voltages. The number of windings needed depends on the current in the ring and the efficiency of extracting that energy. The number of windings needed can be determined by those skilled in the electronic arts.

Conversion of heat to electricity is improved in a closed loop thermoelectric device by utilizing a combination of n-type and p-type semiconductors. These produce a high Seebeck effect thereby producing a higher voltage output for a given thermal differential.

Tight junctions, very low levels of contaminating elements and special surfaces are required to produce a uniform device for high levels of conversion of heat to electrical energy.

Getting alternating current energy out of a circle of thermoelectric elements or coupons requires special conversion components. An important component involved in the extraction of electrical energy is a make-before-break control circuit, which prevents damaging high voltage spikes during current switching. This feature also allows the very high current in the ring to continue uninterrupted.

The device disclosed herein has greater conversion efficiency than the traditional systems currently in use, such as a steam generator.

This thermoelectric device is very quiet when naming thus providing an opportunity to replace noisy gas driven implements and appliances. The basic device has only one mechanical component, a fan that cools electrical components and the cold fins.

To provide these benefits details are given for making and using a simple circular collection of coupons. Each coupon is made by alternating a cold fin that is a metal fin to be cooled or allowed to be cooled, a p-type semi conductor, then a hot fin, that is a fin to be heated, then a n-type semiconductor. Such coupons are place in registry, that is cold fin, p-type, hot fin, n-type, cold fin, p-type, hot fin, n-type and so on until a circle is completed. When the fins are made flat in the region connected to the semiconductor conducting wedge pieces are added to produce continuity to the circle. A single insulator is placed in the circle across which current is removed as desired. A voltage is produced when hot fins are heated. This voltage is proportional to the temperature differential between heated hot fins and cold fins and the number of coupons. For some applications the voltage produced is used directly. To produce alternating current a controller device controls switches. These govern opposite currents in a make-before-break fashion for current loops that have been placed across the insulator. Loop windings around the central stem of a ferrite E-core allow secondary windings around the same stem to produce desired voltage at the frequency of the switching. Primary current loops, switches, controller circuit, and secondary windings comprise an up-converter.

For clarity of the disclosure and definition of the claims the following terms are defined:

"Semiconductor" means: a mixture of one or more elements that has the property of allowing either electrons or holes to move through the mixture depending on whether the mixture has an excess n-type or p-type dopant. The semiconductor nature of thermoelectric wafers is well established in the thermoelectric literature.

"Fin" means: an elongated metal slab with optional tapered ends which are connected on one side to an n-type semiconductor and on the other side to a p-type semiconductor or optionally connected on either side to a conductive wedge.

"Cold fin" means: a fin to be cooled or a fin to be allowed to cool. "Hot fin" means: a fin that is to be heated.

"Coupon" means a repeating component of the thermoelectric device made up of at least one n-type semiconductor, one hot fin, one p-type semiconductor, and one cold fin. In the device having a conductive wedge component with each set of fins and semiconductors a coupon includes the wedge component.

"Kester's solder" means: lead free solder paste containing tin, copper and silver.

"Belleville disk spring" means: deflecting washer that maintains constant compressive pressure through thermal expansion and contraction of other members.

"Wafer" means: an n-type or p-type semiconductor made in the shape of thin slab where the thickness of the shortest dimension is from 1% to 20% of the either of the other dimensions.

"Wafer side" means: the surface area denoted by the larger dimension of a wafer.

"Wafer edge" means: the surface area denoted by the smallest dimension and one or the other dimensions.

Before describing how to produce components of the invention figures are provided that illustrate such a working version. Examples are intended to illustrate the basic principles and elements of the device and is in no way intended to limit the scope of the invention as described in the claims.

BRIEF DESCRIPTION OF DRAWINGS

FIG. 1 illustrates a p-type and an n-type, crystalline wafer.

FIG. 2 illustrates a cold fin, a hot fin, a p-type crystalline wafer and an n-type crystalline wafer along with a conductive wedge that comprise a coupon of the invention.

FIG. 3 illustrates the final positions of the elements of the coupon.

DISCLOSURE OF THE INVENTION

Figure 4:
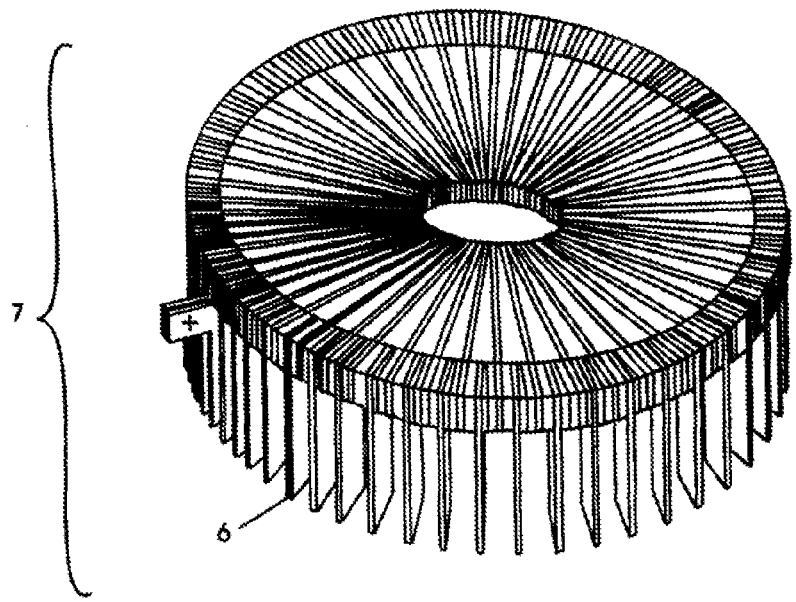
FIG. 4 illustrates the assembled thermoelectric ring, made up of 62 coupons.

To illustrate details of this invention figures are drawn to show components of a few implementations of the invention.

FIG. 1 illustrates a typical p-type 1 and an n-type 2, crystalline wafer. The method of making these wafers is described below. In a preferred embodiment these wafers are replaced by direct application of the n-type or the p-type semiconductor material directly on either the hot fin or the cold fin.

FIG. 2 illustrates a cold fin 3, a hot fin 4, a p-type crystalline wafer 1 and an n-type crystalline wafer 2 along with a conductive wedge 5 that comprises a coupon 6 of this invention. FIG. 2 illustrates an exploded view of the elements of the coupon 6 and the relative position each element will occupy when assembled as a complete coupon. N-type wafer 2 is soldered to hot fin 4 and on the other side to conductive wedge 5. P-type wafer 1 is soldered to cold fin 3 on one side and to hot fin 4 on the other side. In a preferred embodiment the solder paste is Kester's solder having and additional amount of 4% silver added and it is applied in the region of contact between the semiconductor wafer and the hot fin, cold fin and wedge. It should be understood that reversing relative positions of wafer 1 and wafer 2 creates an electronically equivalent device.

FIG. 3 illustrates a cold fin 3, a hot fin 4, a p-type crystalline wafer 1 and an n-type crystalline wafer 2 along with a conductive wedge 5 that comprise a assembled coupon 6 of this invention.

FIG. 4 illustrates a final arrangement of the elements of the coupons 6 in FIG. 3. In a preferred embodiment sixty-two of these coupons complete a thermoelectric ring. This number can be varied depending on the operating voltage desired. The Seebeck voltage also effects how much voltage is produced for a give temperature differential between the hot and cold fins. It should be understood that the cold fins need not be directed at 90 degrees to the hot fins. Furthermore it is possible to fashion the shape of either the hot fin or the cold fin or both to preclude the need for the conductive wedge component. In a preferred embodiment Kester's solder containing an additional 4% silver is applied to each side of each coupon except where the coupon is adjacent to an insulator component of the ring.

Figure 5:
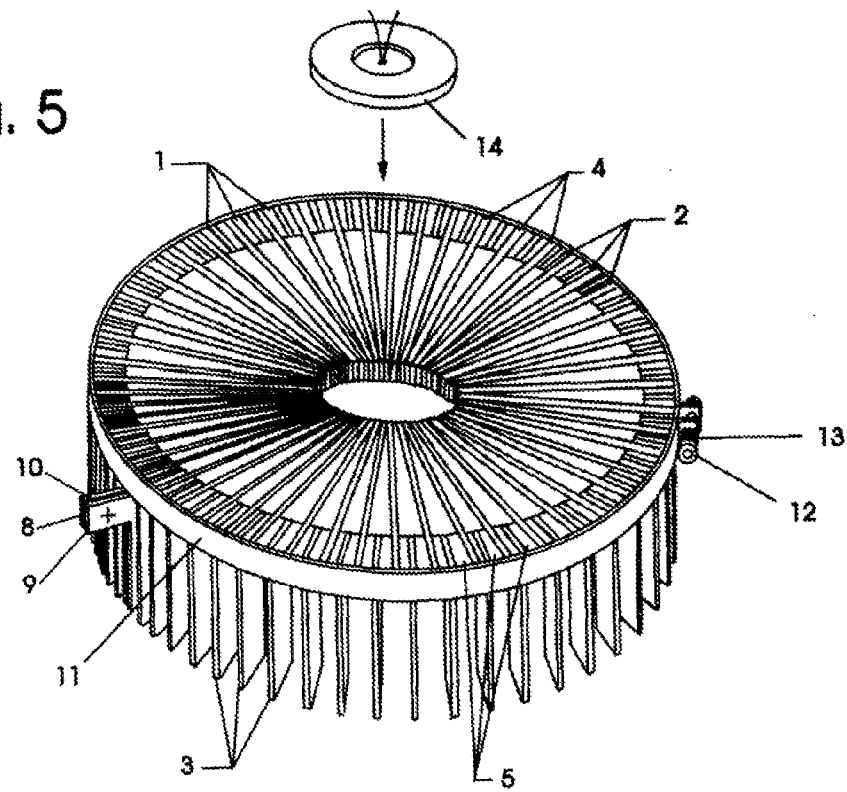
FIG. 5 illustrates how a strap fits around the top portion of the ring to compress the elements by the tensioning of the strap with a bolt as well as a temperature-sensing center piece.

FIG. 5 illustrates the assembled thermoelectric ring 7, made up of 62 coupons of FIG. 3, along with two special cold fins 8 and 9. One of these is an extra cold fin used to allow a cold fin rather than a hot fin for connection to the up-converter. These cold fins are separated by an insulator preferably a mica insulator, 10. The purpose of the special cold fins and mica is to provide terminals for up-converter connections. The mica insulator breaks the electrical circuit of the ring and allows the current produced by the ring to flow into the center tap of the up-converter's primary winding in the direction the control circuit directs. In FIG. 5, the cold fin 3, the p-type wafer 1, the hot fin 4, the n-type wafer 2, and the conductive wedge 5 can be seen in their assembled position, like coupons repeating all the way around the ring with the single interruption of the substitution of two cold fins 8 and 9 separated by insulator 10. FIG. 5 illustrates how the strap 11 fits around the top portion of the ring to compress the elements by the tensioning of the strap with bolt 12. The tension on the strap, and likewise the compression of the elements is maintained at operating temperatures as well as at ambient temperature by a series of Bellville washers 13. Compression is maintained at approximately 100 pounds on the strap 11. In FIG. 5, ceramic part 14 is placed into the center of the ring of hot fins 4 with a temperature sensor to monitor the temperature at the hot fins and to allow for shutdown of heat input should the temperature rise above that tolerated by the semiconductor elements. Other types of spring systems can be used in place of Bellville washers.

Figure 6:
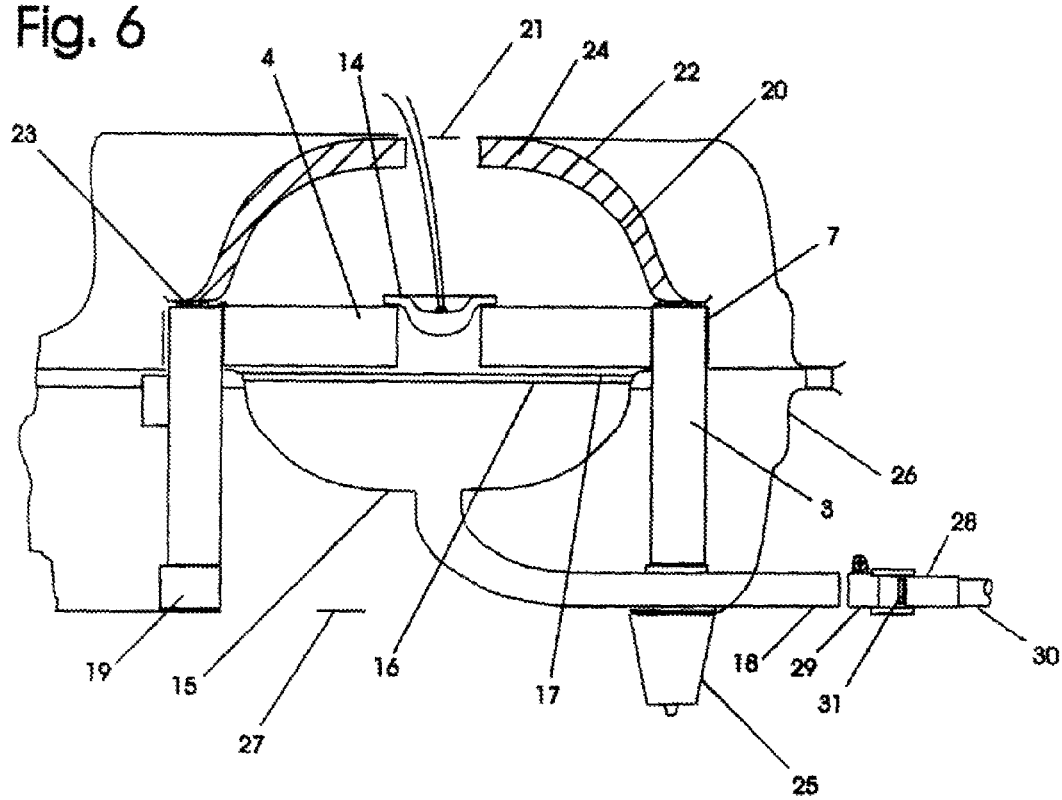
FIG. 6 illustrates a cross section of a gas or liquid combustion version of the thermoelectric generator invention.

FIG. 6 illustrates a cross section of a gas or liquid combustion version of thermoelectric generator invention. Fifteen shows a burner bowl with attached perforated metal 16 that holds a screen 17. This serves to prevent incoming air-fuel mixture from combusting before entering the combustion chamber. Inlet pipe 18 allows the air-fuel mixture to enter the burner bowl. Support ring 19, an insulator, lifts the generator ring so that burner pipe 18 can pass underneath without having to shorten any of the cooling fins 3. Twenty is a top burner bowl with an exhaust hole 21 that is attached to the ring 7. Twenty-two is a larger, outer bowl that serves to give the welded-together, double-bowel combination structural integrity. This is important to maintain the thermoelectric ring in a circle, thus preventing it from going egg-shaped and failing in the electrical conductivity mode. Welded together bowls 20 and 22 are bonded to ring 7 with room temperature vulcanizing rubber 23, such as General Electric high temperature silicone adhesive. This material is also used to attach the cold fins 3 to the supporting ring 19. Twenty-four is thermal insulation material to maintain bowl 20 hot and 22 cool so as to radiate as much heat as possible from the burner screen 17 back on the hot fins 4, thereby increasing power output for the generator. Twenty-five is one of four legs that raise the case 26 off the floor so cooling air can exhaust from opening 27 freely. Legs 25 secure the burner pipe 18 that connects fuel assembly 29 to burner nozzle 28 and the fuel hose 30 to the burner orifice 31. The purpose of the burner orifice 31 is to meter fuel to the burner at an adjustable fuel pressure and to cause air to enter burner pipe 18 at the correct air-fuel mixture. Also in FIG. 6 is shown the metal case 26, that reduces electromagnetic interference of the high frequency aspects of the generator. Not shown is a means to ignite the fuel at the desired place. In a preferred embodiment an ignition spark means is located just above screen 17. Alternatively the fuel can be initially ignited manually.

Figure 7:
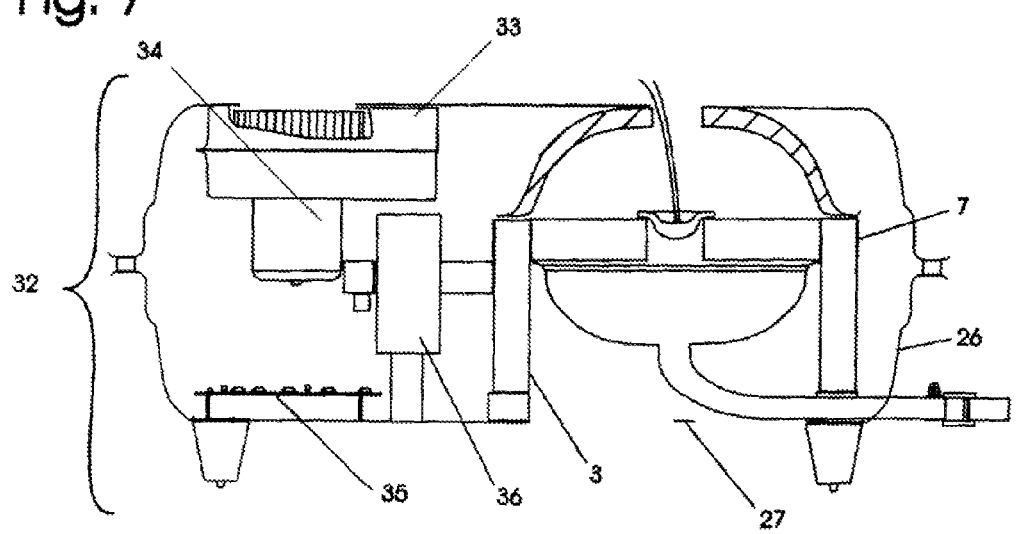
FIG. 7 illustrates an air cooled generator with an air blower open to the top and driven by motor.

FIG. 7 illustrates a generator 32 with an air blower 33 open to the top and driven by motor 34. The motor is powered by an electronic circuit board 35, that derives power from the up-converter 36 attached to the thermoelectric ring 7. Air enters the case 26 through blower 33 and is directed towards the thermoelectric ring, flowing as a vortex, cooling the electronic board 35 and up-converter 36 and finally exiting through the cold fins 3 and then through bottom hole 27 to the outside of case 26.

FIGS. 1 through 7 illustrate a preferred form of this invention being a tabletop type arrangement. It should be understood that the general nature of the thermoelectric device can be fitted to many forms and sizes. For example the arrangement described can be made to be carried in a back pack allowing the user to carry around a source of 120/240 volt alternating current. Such a backpack would allow the use of tools that normally run on alternating current. Still smaller versions could be used to replace a battery pack. Such a backpack version could replace rechargeable batteries and be used with existing rechargeable battery tools.

In a preferred embodiment a hybrid thermoelectric device and mechanical tool is constructed which comprises an electric motor to drive the mechanical tool. An advantage of the hybrid tool is that feedback from the tool can be used to control the rate that fuel is burned. In another preferred embodiment a general version of said hybrid tool has a uniform thermoelectric component that is fitted to a variety of mechanical components. This feature allows a single thermoelectric component to be exchanged among several tool types.

In another preferred embodiment a heat-powered absorption chiller is combined with a thermoelectric generator. In this case the chiller is heated by the exhaust gas from the thermoelectric generator. In a preferred embodiment an exhaust fan is used to move exhaust gas to the absorption chiller. Cold air or chilled fluid from the chiller is then transported as needed for a variety of refrigeration purposes.

In another preferred embodiment all or a portion of chilled fluid from the absorption chiller is transferred to cool the cold fins. In one implementation cold fins are placed in an enclosed non-conductive ring being sealed where said cold fins enter the ring. Chilled liquid from the chiller passes into and out of the enclosed ring. In another preferred embodiment a means is provided to allow some of the heat of combustion to be taken directly to the chiller without passing over hot fins. This feature allows the chiller to operate when there is little need for electricity generation.

Figure 8:
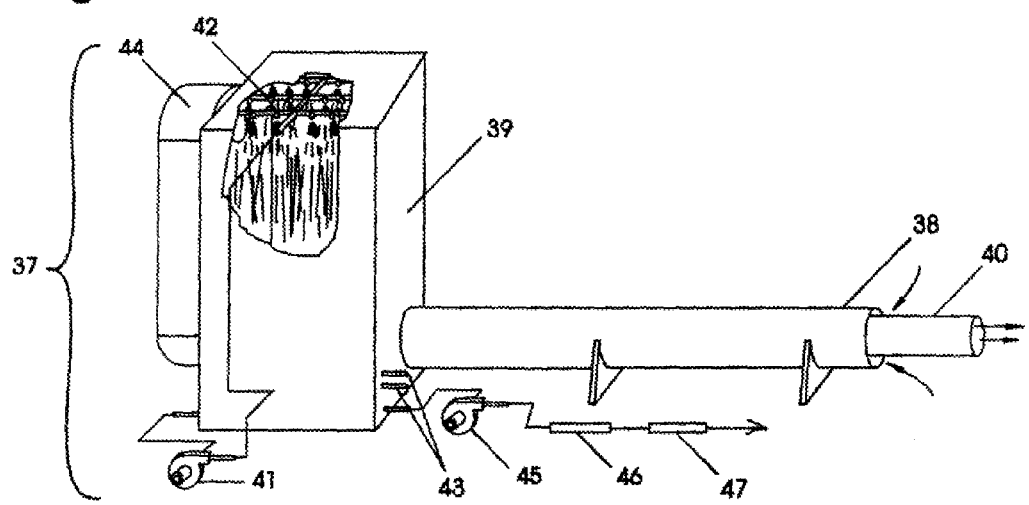
FIG. 8 illustrates an air-source water harvesting system cooled by a chiller powered by a thermoelectric device.

FIG. 8 illustrates an air water harvesting system 37. This appliance operates with a chiller thermoelectric hybrid, not shown, using some or all of the refrigeration effect to harvest water. This appliance can harvest water from the air for drinking purposes, sanitation, to irrigate lawns and even agriculture. Thirty-eight shows an air-inlet pipe for the chill box 39, passing over outlet air in pipe 40. This counter flow method conserves on overall chilling power that is needed. Forty one shows a pump that circulates chilled water to nozzle set 42, which sprays water chilled by the chiller through cooling loop 43 to fall and mix with incoming air from pipe 38. The chilled droplets condense water from supersaturated air and deposit it with the fine droplets to the bottom of chill box 39 where it is re-circulated to nozzles 42, by pump 41. Forty-four is an air blower that pulls cooled air from chill box 39 and pushes it down through the outlet tube 40. Forty-five is a pump that removes harvested water and pushes it through 46 which is an optional ultraviolet system to kill germs, then through filter 47 which removes any particulates before transferring the pure water to a storage tank not shown. Other means of sterilizing water may be used. This water harvesting system can use most or any portion of the absorption chiller thermoelectric hybrid chiller's capacity depending on the priority for water, cooling for the living environment or to meet electrical requirements. Chilled dry air exiting tube 40 can be ducted into a home and used as air conditioning.

In another preferred embodiment a thermoelectrically powered absorption chiller is used to provide chilling to an ice-making machine and an air dehumidifier, and water-harvesting machine. Refrigeration is provided to one or more of these appliances using a chilled fluid loop. Electrical power to drive these appliances is provided from the thermoelectric generator portion of the thermoelectric-absorption chiller hybrid. When the hybrid is used primarily for chilling purposes excess heat is wasted to the environment or used for another process such as heating a building, swimming pool or to dry agricultural products.

Figure 9:
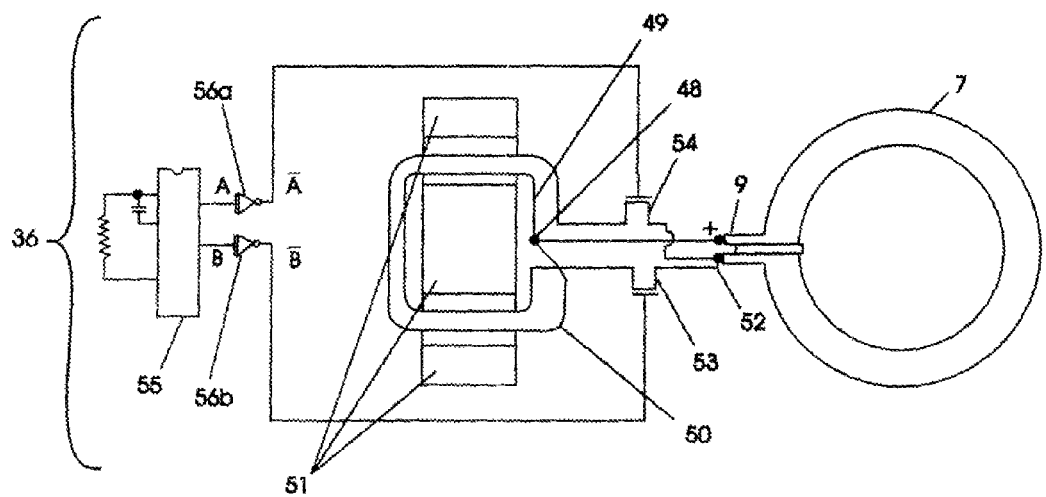
FIG. 9 illustrates an up-converter, which allows alternating current to be obtained from the low voltage, high current ring.

FIG. 9 illustrates the up-converter 36, which allows alternating current to be obtained from the low voltage, high direct current of ring 7 in FIG. 4. The positive lead 9 of thermoelectric ring 7 connects to the center tap 48 of a two turn primary windings 49 and 50 around a ferrite core, 51. In the preferred embodiment the center tap of the two turn primary winding is unbroken. Each end of the winding connects to negative terminal, 52 of the ring 7 with MOSfet switches, 53 and 54. A controller, pulse-width modulator chip 55, controls the opening and closing of the MOSfet switches, through inverted MOSfet drives, 56a and 56b to make-before-break current paths back to the negative terminal 52. To work properly, the MOSfet drives 56a, 56b have inverted outputs, so as to allow the make-before-break feature. When the primary circuit is in alternate make-before-break mode there is no stopping of current in the thermoelectric ring 7 therefore there is no need for current rise time in ring 7 and therefore no inductive spike or loss of power output from the ring. The switching frequency is between 50,000 and 200,000 Hertz. This prevents saturation of a ferrite core 51, about which the two-turn primaries 49 and 50 are oppositely wrapped.

Figure 10:
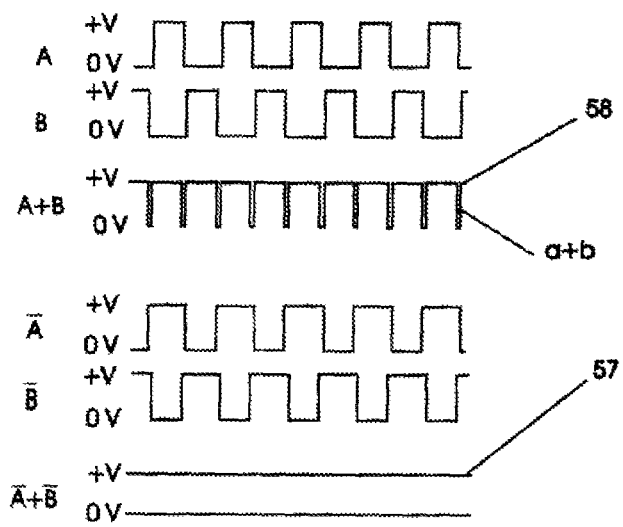
FIG. 10 illustrates the nature of the output voltage in the current mode up-converter compared to non-inverted drive signals.

FIG. 10 illustrates the nature of the output voltage in the current mode prescribed 57 compared to non-inverted drive signals 58. In this inverted drive mode 57, the pulse width modulated control feature is maintained by a compensation of magnetic field rather than an interruption of magnetic field in the ferrite core 51 of FIG. 9.

Figure 11:
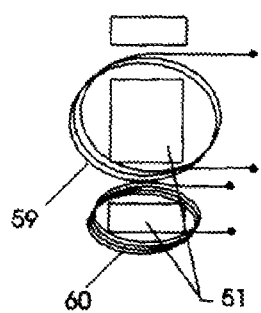
FIG. 11 illustrates the nature of the secondary windings of the up-converter.

FIG. 11 illustrates the nature of the secondary windings 59 and 60. In the preferred embodiment multiple output AC voltages are obtained using one or more secondary windings around the ferrite core 51. The center stem of the ferrite core 51 has in addition to the primary windings, secondary multi-turn windings 59 so as to increase the output voltage of the secondary. For example, 40 turns of secondary winding 59 will produce 120 volts when 3 volts is produced in the primary winding. In a preferred embodiment, in addition to the other secondary winding 60 is one or more windings on one outer leg of the ferrite core 51. To obtain the desired output voltages, the number of turns in the secondary around the outer stem of 51 requires two times more turns than if they were around the center stem of 51 because field strength is only half that in the center stem of the ferrite core. In preferred embodiment several separate windings are used to obtain isolated low voltage power sources for electronic control circuits.

Figure 12:
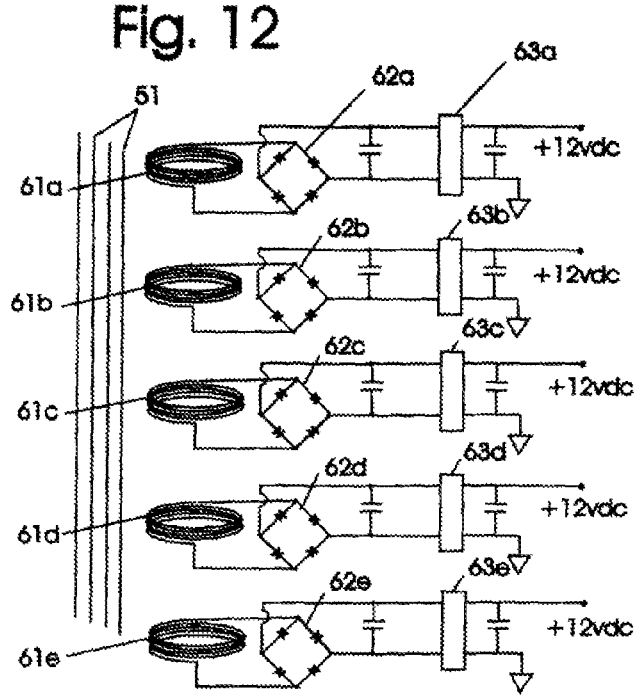
FIG. 12 illustrates five separate windings with separate full-wave bridge rectifiers.

FIG. 12 illustrates five separate windings, 61a, 61b, 61c, 61d and 61e, with separate full-wave bridge rectifiers 62a, 62b, 62c, 62d and 62e. The outputs of the bridge rectifiers input to separate +12-volt DC regulators, 63a, 63b, 63c, 63d and 63e. In a preferred embodiment +12 volt DC regulators 63a through e are used to drive separate control functions that need to be isolated from one another.

Figure 13:
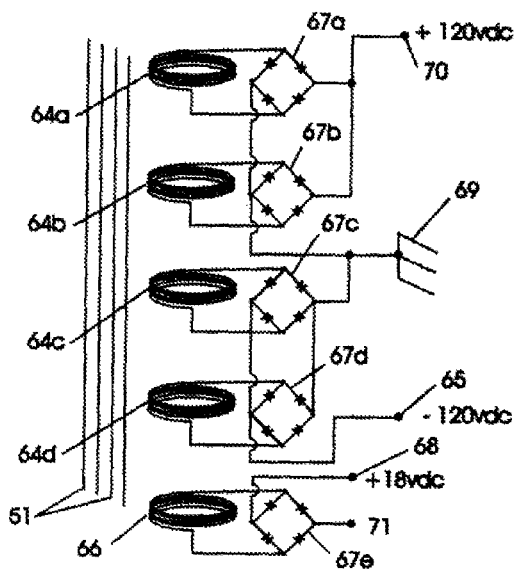
FIG. 13 illustrates a preferred output of four secondary high voltage windings and one low voltage winding.

FIG. 13 illustrates a preferred output of 4 secondary high voltage output windings 64a, 64b, 64c, 64d, and one low voltage secondary winding 66. The low voltage output is used to supply power for control circuits. The output windings 64a-d collect high frequency AC power from the primary to secondary windings through the ferrite core 51, therefore each secondary winding 64a-d is rectified by full wave bridges 67a, 67b, 67c, and 67d to produce 120 volt DC outputs. Full wave bridge terminals are connected to obtain higher combined voltage outputs. Terminal 69 is designated as earth ground. In a preferred embodiment the output between bridge rectifiers 67b and 67c is taken to earth ground. Thus the voltage between earth ground and terminal 70 is +120-volts DC. The output between earth ground and 65 is −120 DC. Output 69 or 71 can be designated as electronic ground for the control system, or the ground for the control system can remain isolated, as the particular circuit requires.

Figure 14:
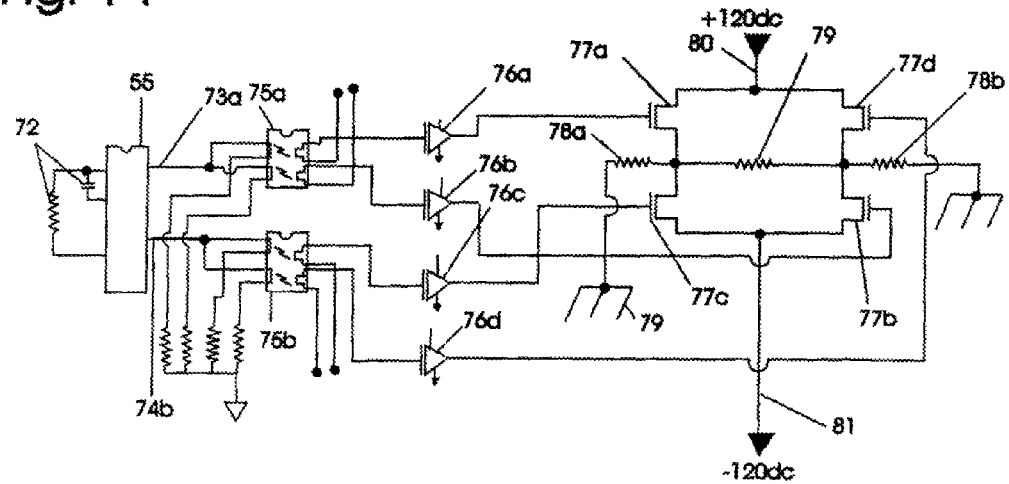
FIG. 14 illustrates a preferred embodiment using pulse width modulator.

FIG. 14 illustrates a preferred embodiment using a pulse width modulator 55 tuned to operate at 50 or 60 Hertz by RC elements 72. Outputs 73a and 74b drive individual opto-isolating, dual switches 75a and 75b. Each opto-isolator drives two MOSfet non-inverted drivers 76a-d. The power supplies for these drivers are each isolated power supplies of FIG. 12. The output of each MOSfet driver 76a-d is connected to one of 4 MOSfet switches, 77a-d, arranged as an H-bridge. One terminal, between MOSfet switches 77a and 77c of the H-bridge is connected to pass 120 volts AC through load 78a to earth ground. The terminal between MOSfet switches 77a and 77d is the input from the +120 volt output of FIG. 13, bridge terminal 80. The terminal between MOSfet switches 77c and 77b is the −120 volt terminal 65 of FIG. 13. In FIG. 14, the 240-volt AC load terminals are between MOSfet switches 77a and 77b and 77c and 77d. This arrangement drives a 240-volt AC load and two additional 120-volts AC loads 78a and 78b, each terminated at earth ground.

Figure 15:
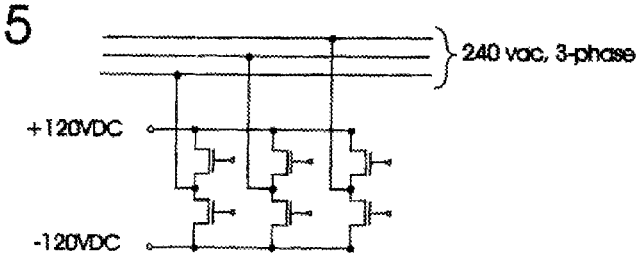
FIG. 15 illustrates a 3-phase output arrangement that is realized by adding two additional MOSfet switches to the H-bridge.

FIG. 15 illustrates a 3-phase output arrangement that is realized by adding two additional MOSfet switches to the H-bridge and the appropriate 3-phase control circuitry. Higher numbers of phases are also possible and are advantageous for transportation applications where high starting torque is needed on traction motors.

Figure 16:
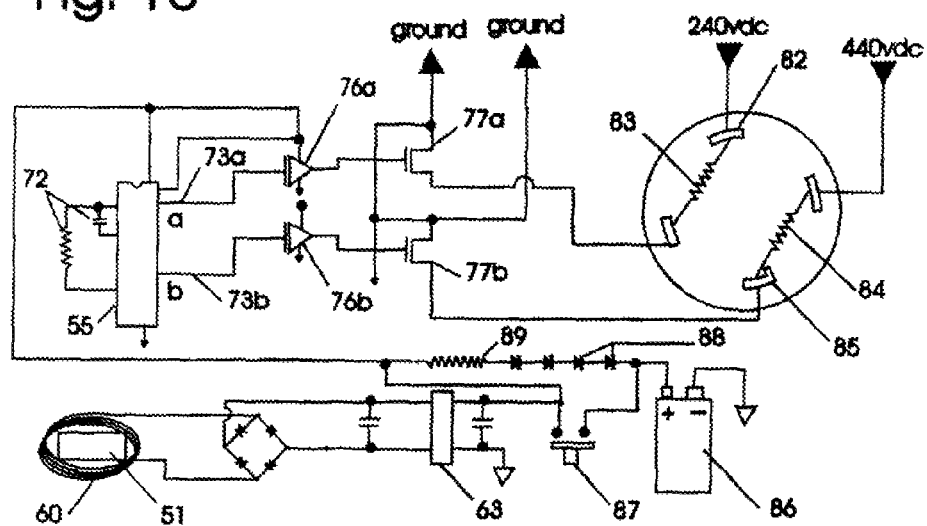
FIG. 16 illustrates a preferred embodiment of the output signal processing for simplicity and reliability.

FIG. 16 illustrates a preferred embodiment of a limited version of the output signal processing shown is FIG. 14. A pulse width modulator 55 is driven by a regulated 12-volt DC output 63 for all chips of the circuit. The pulse width modular 55 output 73a drives a non-inverting MOSfet driver 76a and the 73b output of the pulse width modulator drives a non-inverted MOSfet drive 76b. MOSfet driver 76a drives MOSfet switch 77a. MOSfet driver 76b drives MOSfet switch 77b. Switch 77a switches load 83 to ground. A 120 volts AC load 83 is connected between socket terminal 82, fed by +240 volt DC at terminal 82. Switch 77b switches load 84 to ground at socket terminal 85. A 240 volts AC load 84 can be connected between socket terminal 85, fed by +440 volt DC. When the pulse width modulator chip 55 is set to operate at a frequency of 50/60 Hertz by RC elements 72, the loads 83, 84 operate as if fed by 120 and 240 volt AC power supplies. This power supply is a simple on-off supply operating in the on mode at the full peak-to-peak voltage with 240 volts DC and 440 volts DC. The uniqueness of this variant is in the very few parts that are required to make it operate. The loads are powered alternately for half of the 50/60-Hertz cycle and the circuit is open alternately for the other half of the cycle providing a quasi-square-wave drive. Current is interrupted for the other half of the cycle. The simplicity of this circuit favors reliability under rugged operating conditions. All chips have a common low voltage ground. All chips have common regulated 12-volt DC power from regulator 63. This architecture simplifies the control circuitry. For initializing the circuit a rechargeable 9-volt battery 86 is used with its ground connected to electronic ground. The positive terminal is connected to a momentary-on electrical switch, 87 and then connected to the common 12 volt bus. Four diodes 88 are in series across momentary switch 87 with a 1000-ohm resistor 89. The cathode end of the diode string is connected to the plus terminal of the battery to form a current limiting battery charging circuit when the ferrite core 51 is active. To start the output signal processing circuit the momentary switch 87 is pressed allowing all elements of the circuit to be energized directly from the battery 86. When the momentary switch 87 is released the power supply 63 is active and because core 51 is active this operates the pulse width modulator chip 55 and charges the battery 86 from coil 60 through the diode string 88 and resistor 89. In a preferred embodiment the momentary switch is pressed about 20 seconds after the generator burner of the device is ignited. After the momentary switch 87 is released, current from regulated 12-volt DC 63 can then recharge the 9-volt battery 86 through the diode string and resistor. Resistor 89 limits current and voltage across the string, reduced by the diodes, dropping charging voltage to 1.2 volts higher than the battery's nominal 9 volts.

Figure 17:
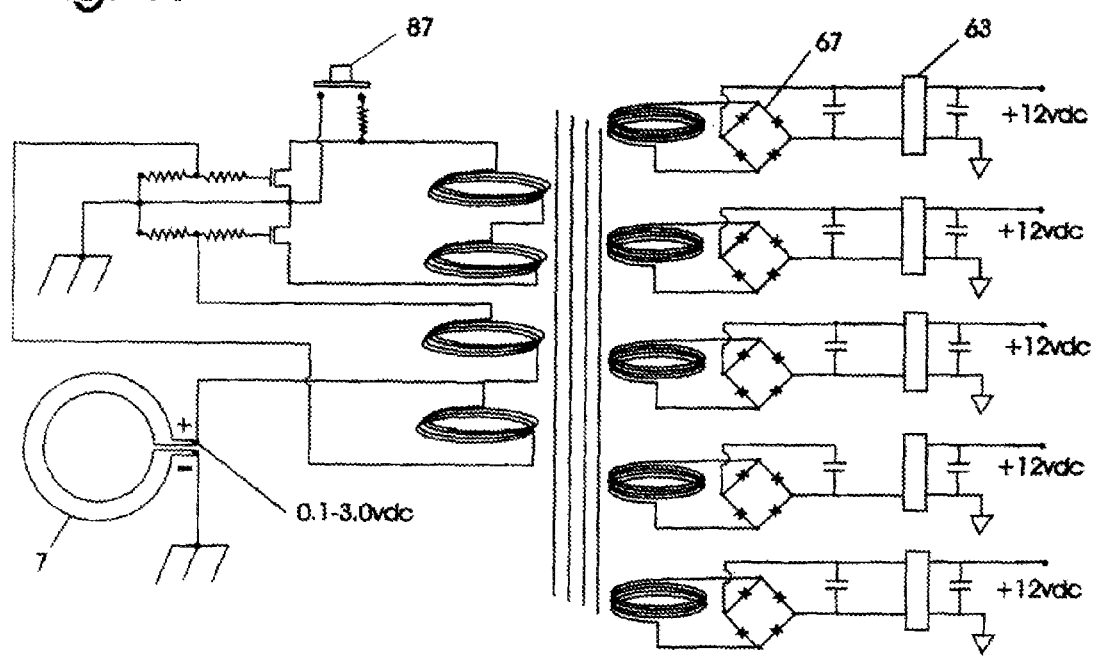
FIG. 17 shows another preferred embodiment where devices utilize power from a self-excited means using ring current.

FIG. 17 is a schematic diagram that shows another preferred embodiment where the device utilizes power from a circle of coupons comprising ring 7 without the need for a battery. As the ring heats up to generate from 0.1 to 3.0 volt output, this circuit converts this low voltage into five or more isolated, 12 volts DC power supplies. These then power all elements of the control circuit as shown in FIGS. 14 and 16.

Figure 18:
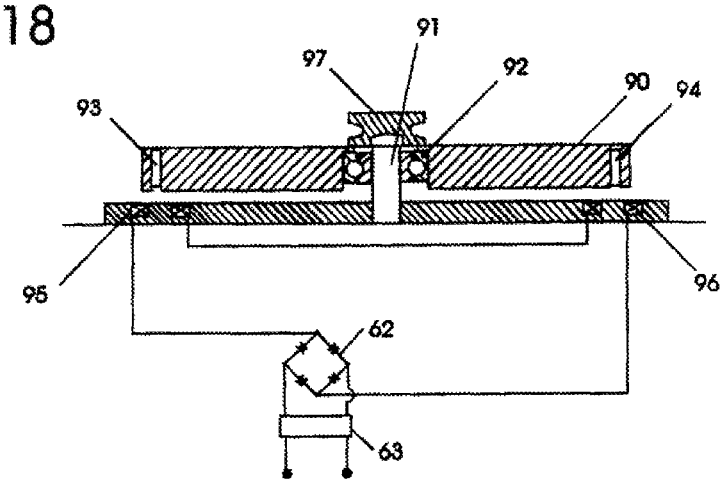
FIG. 18 shows another preferred embodiment where the circuit is initiated by manual means.

FIG. 18 shows another preferred embodiment where the circuit is initiated by manual means. A flywheel 90 is fitted to a shaft 91 by means of a bearing 92. The flywheel has magnets 93 and 94 with vertical poles in opposite directions. Beneath the flywheel are coils 95 and 96 series connected to full-wave bridge 62. A pulley 97 is attached above the flywheel 90. A string can be wrapped about the pulley 97 and when the string is pulled the flywheel 90 spins with the magnets 93 and 94 energize coil 95 and 96 inducing a current in the full Wave Bridge 62. Enough current is produced to drive the voltage regulator 63 supplying regulated power to the high frequency drive circuit in FIGS. 9, 14 and 16.

Figure 19:
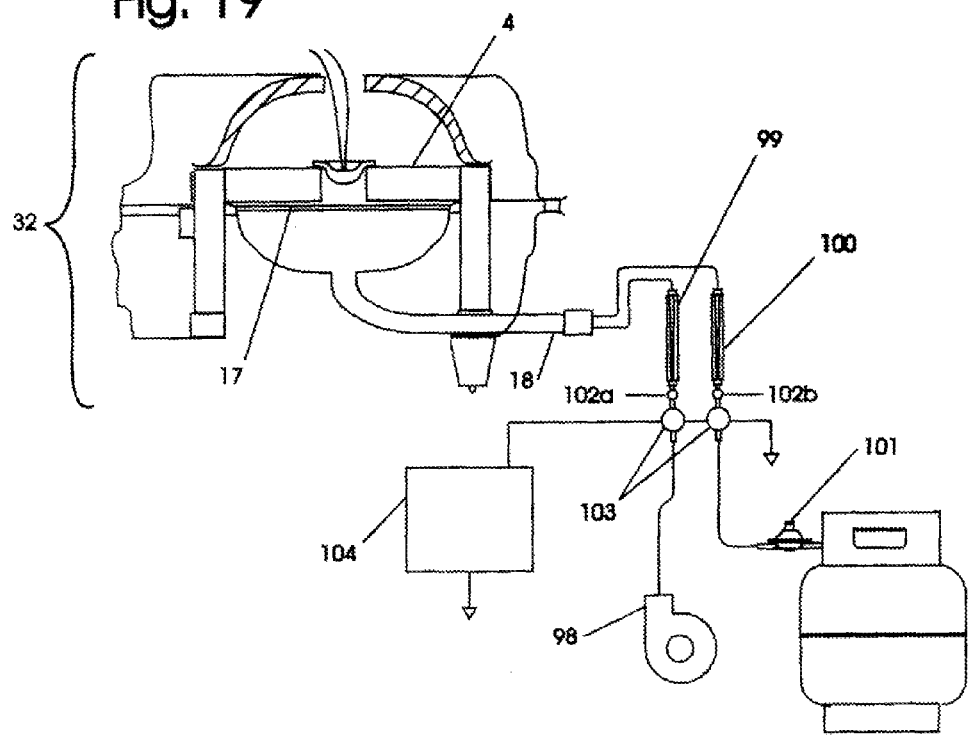
FIG. 19 illustrates a control system for generator and applications.

FIG. 19 illustrates a control system for generator 32 and applications. The basic heat control system for the generator was described in FIG. 6 where a high-pressure stream of fuel, metered through an orifice 31 induces air to mix with the fuel in a 14-16 to one mixture to insure proper combustion. Ignition of the fuel-air mixture above the burner and beneath the hot fins of the generator causes heat from the flame to heat fins 4. This is a manual system with high air-fuel flow, that causing the heat needed for anticipated electrical output above the burner screen 17. The control invention allows the generator to be electronically controlled on and off. A high-pressure air induction system in the form of an air blower 98 supplies air to burner pipe 18. The air supply is metered through a valve 102a and flow meter 99 and into this air supply, fuel is metered by flow meter 100 into the pressurized air-stream in burner pipe 18 from a pressure regulated fuel source 101 through a metering orifice 102b into the air supply. Electrically operated control valves 103 connected electrically in parallel are used to turn the metered air and fuel supplies on or off as the electronic control system 104 demands. This is an on/off system that can be operated with manually preset flow rates in anticipation of generator loading.

Figure 20:
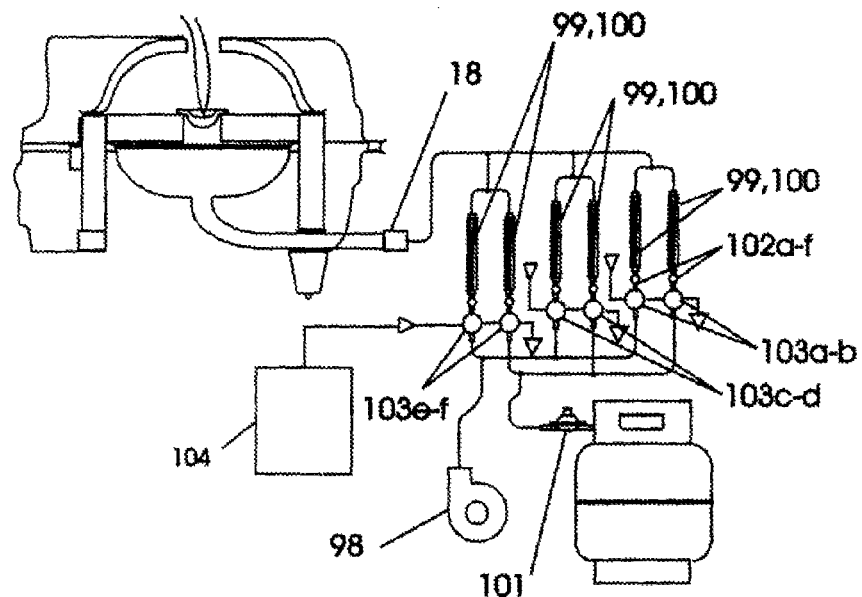
FIG. 20 illustrates another variant that uses a pressurized air supply blower and a pressurized fuel supply.

FIG. 20 illustrates another variant that uses a pressurized air supply blower 98 and a pressurized fuel supply from a regulated pressure source 101 feeding through pairs of valves 103a-f feeding flow meters 99, 100 that allow an adjustment of air-fuel with valves 102a-f adjusting mixture and total flow of the fuel-air mixtures for each pair of control features that can be controlled on/off by valves 103a-b, c-d, e-f, and electronic means 104.

Figure 21:
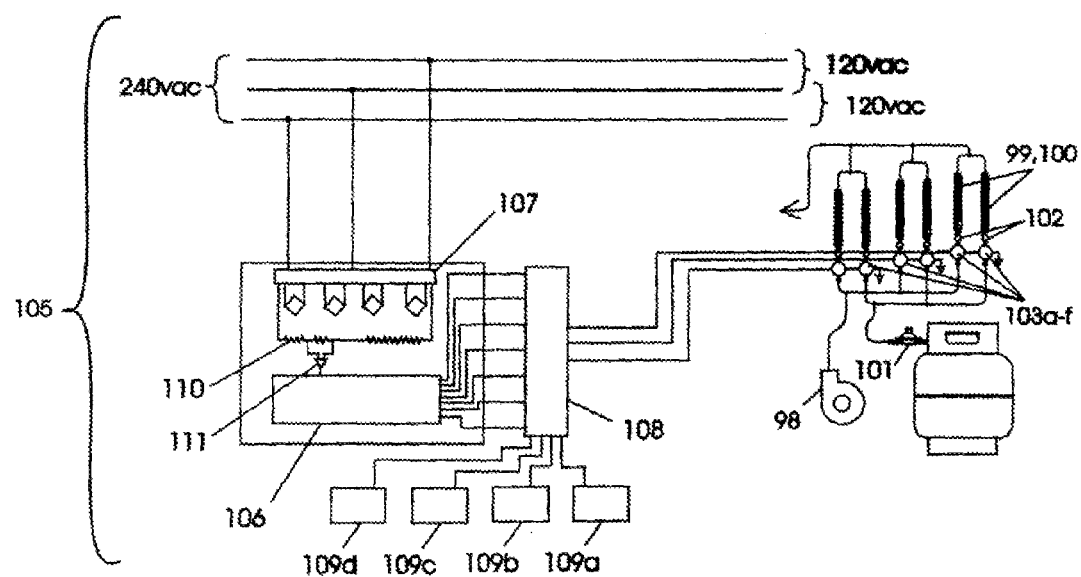
FIG. 21 illustrates a means to achieve fuel modulation by electronic control for bus voltage.

FIG. 21 illustrates a device 105 to achieve fuel modulation by electronic control for bus voltage regulation due to electrical loading of the generator. This variant uses pairs of air-fuel control valves 103a-f with metering adjustment valves 102 under individual flow meters sets 99, 100, the first set adjusted to supply heat for 17% of generator output capacity, the second set to 34% output capacity and another set adjusted to 51% of output capacity. By electronically selecting combinations of the three or more valve-sets 103a-f, the generator's fuel input can be adjusted to produce no output with all valve pairs off or 17% with the first pair only on, 34% with the second pair on, 51% with the third pair on, 68% with the first and third pairs on, 85% with the second and third pairs on and 100% with all valve pairs on. Valve pairs can be selected by a micro-controller 106, monitoring voltage on the output bus 107, programmed so as to use the least amount of fuel to maintain output voltage above a preset value of about 220 volts AC, by heat control bus 108 to heat below an upper bus voltage of about 240 volts AC. This is achieved by controller 109a selection of none, or any combination of just three, valve pairs 103a-f. This feature allows the generator to burn the least amount of fuel while maintaining output voltage between predetermined limits. By selecting all three valve pairs a 100% fuel flow can be achieved. Also, a combination of "on" and "off" valve pairs allows fuel burn to more closely match or slightly surpass that needed for electric production between output voltage limits, including all off when no electric production is needed. By using only three valve pairs in combination, fuel-air flow can be adjusted for output power and can be controlled by the microprocessor 106 to burn the least air-fuel needed to maintain line voltage on the output bus 107 within preset voltage limits, to follow load variations on the bus. A high temperature sensor 109b, with sensor located on ceramic plug 14 of FIG. 5 above the hot fins 4, senses for over-temperature and instructs the micro-controller 106 to shut off all air-fuel valve pairs to the burner when there is an over-temperature condition. A temperature sensor 109c, located on one of the cold fins 3 allows the micro-controller to sense an over-temperature of the voltage producing junctions, possibly because the cooling fan has failed and the micro-controller 106 causes a shut-off of all fuel-air mixture valves 103a-f to the burner in an over-temperature condition. A resistor ladder 110 across the power bus 107 is used to divide the voltage across the DC side of the power bridges, fed by high frequency power from the generator's up-converter 36 shown in FIGS. 7 and 9. As a part of the resistor ladder, voltage reference signals, adjusted with a manually set or computer set potentiometer, feed into a differential operational amplifier 111 that is set to send an adjustment signal by the micro-controller 106 to adjust the operation of the pulse-width-modulator chip 55 of FIG. 9 when bus voltage rises or falls beyond preset limit. This function adjusts and controls the operation of the up-converter drive shown in FIG. 9, regulating voltage at bus 107. The potentiometer 110 is pre-set to an arbitrary value of approximately 100 Volts. If the loading on the power bus increases to cause the output of the generator to fall below 90 Volts, the generator's micro-controller 106 off-switches the load, shuts off the air-fuel supply, and the control system goes into shut-down safe mode. The power bus 107 is disabled but the cooling fan motor 34 in FIG. 7 continues to run for an additional 3 minutes to cool the voltage producing portion of the generator ring 7, preventing undue stress on the generator. Should the output current exceed the rated capacity of the generator for more than one second, a current sensing chip 109d, which is a differential operational amplifier across a shunt in series with an output power leg, causes an interrupt of the pulse width modulator chip 55 in FIGS. 9, 14 and 16. This event triggers a shutdown of the output power from the generator 32.

Figure 22:
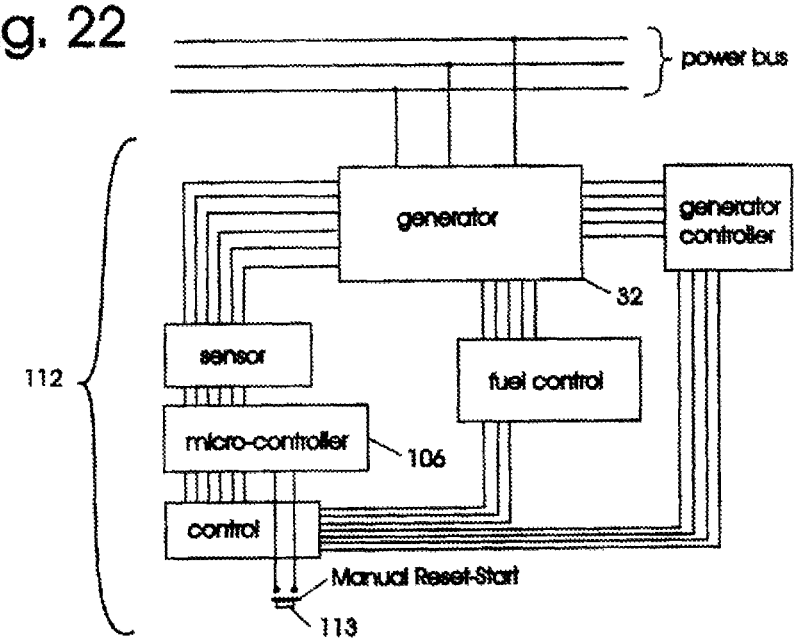
FIG. 22 diagrams a preferred control system configured to shut down the air-fuel mixture valves but continues powering a tooling fan.

FIG. 22 diagrams a preferred control system 112. This system is configured to shut down the air-fuel mixture valves 103a-f, but continues power to the cooling fan motor 34 so as to prevent generator thermal stress. To restart the generator, the operator can manually restart with switch 113 after determining the cause of the over current and waiting 3 minutes, going through the manual restart procedure for the generator. The control system 112 can also be programmed to attempt to restart the generator automatically, after performing internal diagnostics to determine the cause of the over current before restarting the generator and reconnecting to the load.

Figure 23:
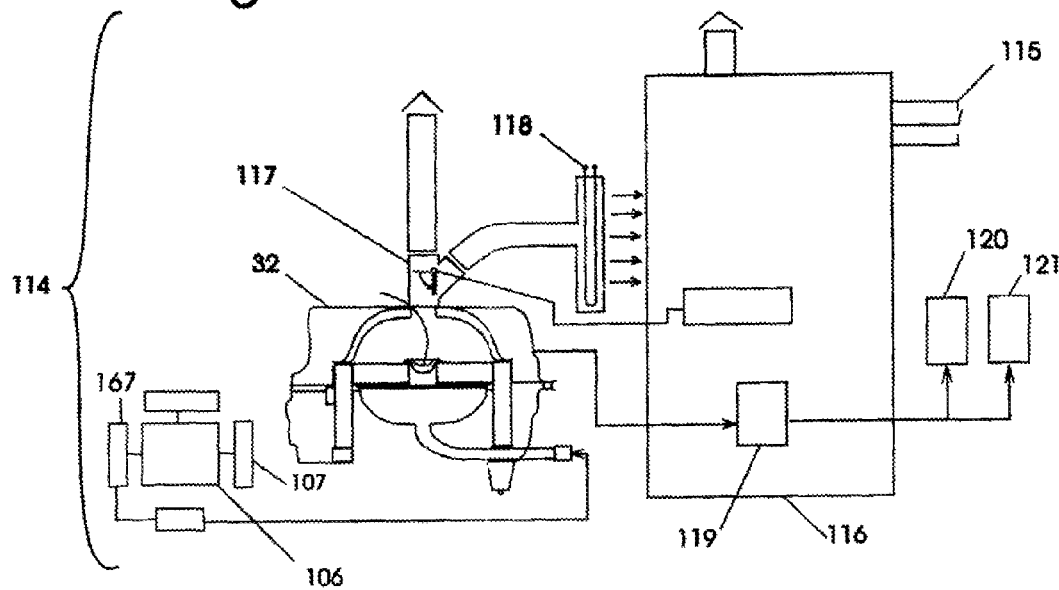
FIG. 23 illustrates a generator-absorption chiller hybrid that uses a thermoelectric device as a power supply for the chiller.

FIG. 23 illustrates a generator-absorption-chiller hybrid 114, configured to operate as the electric power supply for a heat powered, heater-absorption chiller hybrid with unique controls illustrated in FIG. 21 that allow it to operate as a seamless alternative to the power grid. When the absorption chiller 116 is switched on, the generator is auto-started by micro-controller 106 to be in the "on and ready" mode; ready to supply the power needed to operate the absorption chiller 116. The absorption chiller then has electric power and heat from the generator's exhaust switched-in by diverter valve 117 directed by micro-controller 106 to begin refrigeration or heating operations. The absorption chiller is under the control of a thermostat 115 that determines the summer/winter mode and temperature in which the absorption chiller 116 will operate and whether it needs to operate to satisfy interior climate control requirements of the home or environmental space. The air-fuel mixture and quantity of heat supplied to the generator is controlled by the micro-controller 106 to operate with just enough electrical output capacity to satisfy the electrical power for the absorption chiller. Micro-controller 106 can also be programmed to produce enough energy to satisfy the needs of other appliances in the residence 120 and that of other residences 121, or a commercial building. The electrical power level of the generator is adjusted by micro-controller 106 by sensing the voltage across the DC output bus 107, the micro-processor adjusting air-fuel supply valves 103a-f, controlling near the center of an adjustable preset bus voltage range. Should the bus voltage rise above the nominal preset voltage level, the micro-controller 106 selects air-fuel valve sets 103a-c that lower or decrease burn rate to achieve and control at a nominal, preset output bus 107 voltage. The same heat that exits the generator 32, normally wasted exhaust gas, is diverted to pass through and operates the absorption chiller 116. Solenoid actuated diverter valve 117 in the exhaust stream of the generator 32 directs exhaust heat either through the absorption chiller 116, or to exit to ambient when there is no absorption chiller requirement. This way, the absorption chiller's standard control system can call for heat or chill with the same out of the box controls. The generator is the power source with proportional control valves. Previous to implementation of this invention the generator burned unneeded fuel in the absorption chiller. When the absorption chiller's thermostat 115 calls for more heat than the solenoid activated diverter valve 117 can supply, supplemental heating through resistive heating element 118 powered by the generator can be activated. No separate fuel supply is needed to operate the chiller portion of the absorption chiller 116; the generator's diverted exhaust and supplemental electric heating 118 being adequate. Generator power 119 for chiller also passes through to power the home electrical loads 120 and 121.

Figure 24:
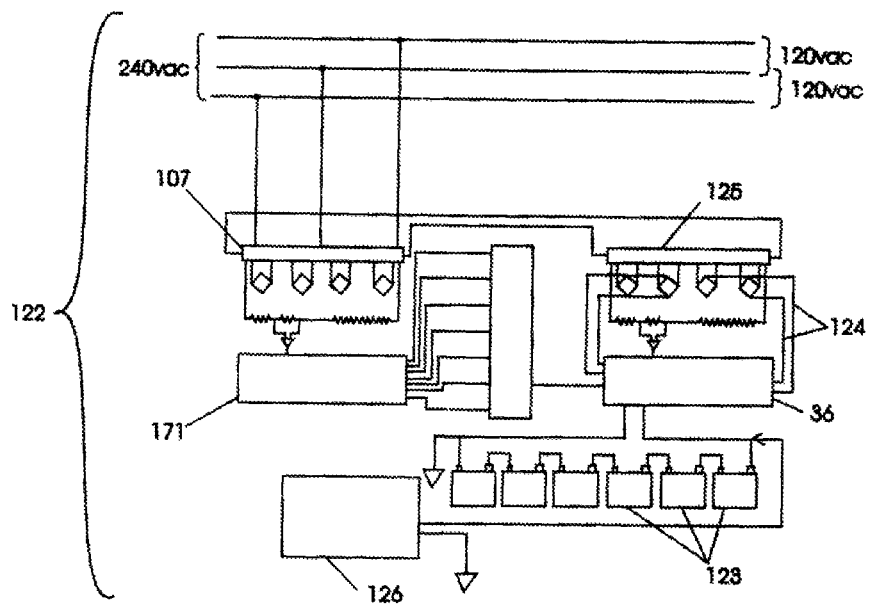
FIG. 24 illustrates a means that allows the small generator to operate as if it had much larger capacity.

FIG. 24 illustrates a device 122 that allows the small generator to operate as if it were much larger in capacity. An up-converter circuit 36 similar to the one described in FIG. 9 is driven by a bank of batteries 123 instead of thermoelectric ring 7. This system is connected to the generator's power bus 107 to help support the bus loading when the generator is overloaded. A bank of batteries 123, for example about six automobile batteries, driving a push-pull up-converter 36 with DC bridges is connected by control lines 124 to allow the generator and battery bank to work together to output power when the generator's output bus 107 is overloaded. The battery bank delivers current when the generator's bus falls below a lower voltage limit than the generator normally controls to maintain. The battery bank's power bus 125 and the generator's power bus 107 are connected in parallel to power the H-bridge driving the AC output bus. Battery bank 123 can be charged by the generator or by the grid with battery charger 126. The two systems can operate independently or they can work together, instantaneously allowing the generator to operate as if it had a twice larger output power capacity for several minutes until the battery bank depletes. The tying of the two systems, generator and battery, together at the DC bus is novel. When the power bus is pulled lower than a preset value that the generator's controller tries to maintain, the battery system is already on line to help hold generator bus at preset voltage level. Otherwise the bus voltage would be pulled lower by the increased loading. The battery boost system, working in conjunction with the generator, will allow the generator to operate at near the minimum bus voltage, burning the minimum amount of fuel, yet the system will be able to respond to instantaneous bus loading with the aid of battery boost. Should the generator nm out of fuel, the battery bank can support the load until fuel supplies are restored. This is another benefit of the thermoelectric-battery combination 122.

An alternative to combining multiple units as described above is to build a ring with more coupons in the circular array. For example by modifying the shape of the conductive wedge and elongating hot fins an 18-inch thermoelectric ring can be manufactured. A standard 9-inch model generator is composed of about 60 coupons, each coupon made up of a cold fin, hot fin, p-wafer, n-wafer and a conductive wedge. Sixty, 6° conductive wedges used as one of the components of each coupon forces closure of a nine inch diameter circular assembly, the ring closing on itself with the ends of the ring electrically insulated by inclusion of an insulator and up-converter. The up-converter passes continuous ring current alternately through two, switched primary windings in a make-before-break fashion as described above. To improve the power output conductive wedges with less taper are used in each coupon. Wedges with less taper increase the number of coupons required to close the ring. The greater the number of coupons in a ring, the higher the cumulative ring voltage. Wedge thickness adds to the total copper resistance in the ring. A 2.47° wedge is required to close an 18-inch ring and conductive wedge is about half as thick as the 6° wedge in a ring of 60 coupons. This thinner wedge reduces the copper wedge resistance for a 146-coupon ring to half that of 60 coupon ring. A certain copper thickness of at least 0.125 inches in required for ¾×¾ inch wafers. Copper is used as hot and cold fins because it serves a dual role. Copper fins not only conduct current through wafers around the ring, these fins also conduct heat into and out of surfaces of the wafers, creating the thermoelectric voltage that drives the high current around the ring and through the up-converter. Example 1 compares electrical parameters for two sizes of rings for thermoelectric generators. Example 2 describes operating performance for two ring sizes.

EXAMPLE 1

| Conductive wedge | Wedges/ring | Wedge Resistance | Cu Ring Resistance |
| --- | --- | --- | --- |
| Standard-9 inch ring, 6° wedge | 60 | 4.75E−7 Ohm | 4.7E−5 Ohm |
| 18" ring, 2.47° wedge | 146 | 1.9E−7 Ohm | 7.1E−5 Ohm |

The following are measured and calculated generator performance values for various wafer voltages generated by changes in temperature for two specified diameters:

EXAMPLE 2

Standard Model, a 9-Inch Diameter Ring

| Wafer voltage | Number of coupons | Watts Output | Horsepower |
| --- | --- | --- | --- |
| 0.025 | 60 | 9,000 | 12* |
| 0.05 | 60 | 36,000 | 48 |
| 0.072 | 60 | 74,649 | 100 |
| 0.092 | 60 | 123,289 | 164 |

*This horsepower value is proven while others are calculated.

"Double diameter" model is an 18-inch diameter suitable for buses and trucks.

| Wafer voltage | Number of coupons | Watts output | Horsepower expected |
| --- | --- | --- | --- |
| 0.025 | 146 | 21,903 | 29 |
| 0.05 | 146 | 87,612 | 117 |
| 0.072 | 146 | 181,672 | 242 |
| 0.092 | 146 | 300,047 | 400 |

In a preferred embodiment a programmable microcontroller is used to drop off generator loading in an overload condition, or delay the start of a new load until the generator's voltage and power output capacity can be restored and powered up to assume the new load. The programmable microcontroller is helpful to signal the generator a power up is needed for an appliance, when the generator is operating in economy mode, or is in the off mode, before a new load is assumed. A programmable microcontroller is an electrical device in a circuit that senses voltage and voltage rate changes and has the capacity to regulate the amount of current that passes through it. It also has the capacity to exchange information with other electrical devices including computers and controllers and to respond to requests from those devices.

In another preferred embodiment the thermoelectric generator uses a carburetor to burn all forms of liquid fuel in the thermoelectric generator. A blower supplies pressurized air to flow meters and a tank. Metered air is bubbled below the liquid level. Atomized air-fuel mixture exits at the top of tank. Pressurized air from a blower is controlled by a flow meter and is mixed with the atomized air-fuel mixture. Tubing connects the combined air with atomized fuel to the burner pipe of the thermoelectric generator. The same control system described in FIGS. 21, 22 and 24 is used to control air-fuel supply to generator. A cartridge heater with thermostatic control is used to heat fuel for better atomization of heavy fuels in cold arctic climates. In a preferred embodiment gas instead of air is pumped into the carburetor to create a more combustible mixture of combined fuels. For low voltage applications such as electro-dialysis desalination, current is used at the voltage provided by ring 7 without conversion through leads on each side of the insulator 10. For higher direct current applications voltage is increased by make-before-break up-converter through primary and secondary windings where up-converter leads are attached to each side of the insulator 10 through cold fin terminals 8 and 9.

In a preferred embodiment the thermoelectric generator uses hot fins coated with a combustion catalyst when combustion occurs at or near the hot fins.

The n-type and p-type semiconductors play an important role in allowing high conversion efficiency. Example 3 gives the range of elements and a preferred amount of elements making up the n-type semiconductor. Example 4 gives the range and preferred amount of the p-type semiconductor.

EXAMPLE 3 n-Type Semiconductor Composition 1

| Element | Range | Preferred Amount |
| --- | --- | --- |
| Selenium | 5%-10% | 6% |
| Bismuth | 40%-60% | 47% |
| Tellurium | remainder to 100% | 47% |

EXAMPLE 4 p-Type Semiconductor Composition 2

| Element | Range | Preferred Amount |
|---|---|---|
| Antimony | 28%-30% | 29.1% |
| Bismuth | 8%-10% | 9.5% |
| Tellurium | remainder to 100% | 61.4% |

Copper and other elements greatly degrade performance of these semiconductor wafers therefore high purity elements are preferred. Each chemical element should be at least 99.9% pure and preferably 99.999% pure. In a preferred embodiment said elements are combined and melted to a temperature of about 800° C. before being cast into a desired shape.

Slow cooling of the combined elements make high quality semiconductors. A preferred size for the wafers is 1.5 mm thick by 2-cm by-2 cm. For ease of presentation the 2-cm by 2-cm sides are called faces and the 1.5-mm.times.2-cm sides are called "sides". To achieve slow cooling combined melted semiconductor material is pour into a mold of the desired shape having the thin direction cast vertically, that is, sides are facing horizontally. In a preferred embodiment the wall of the mold is coated with hollow ceramic spheres obtained from fly-ash material that floats on water. The ceramic spheres are in the form of a powder that has relatively uniform size of less than 10 microns. Preferably the powder is held together in the mold by propylene glycol or milk of magnesia. The slow cooling rate is determined by the thermal conductivity of the casting matrix, the size and shape of the wafer and the starting temperature. For wafers 1.5 mm thick and 2 cm×2 cm in size the cooling rate is estimated to be an average of 100 degrees centigrade per minute. In a preferred embodiment cast faces of the semiconductor are lightly smoothed using a belt sander with 100-grit aluminum oxide sandpaper. Properly cast wafers have a crystal grain size that microscopically appears to approach 2-mm. Transfer of electrons across the semiconductor is improved when some portions of the semiconductor are without a boundary barrier in the direction of flight of the electrons and holes.

Semiconductors are protected from infiltration of copper atoms and components of solder by coating them entirely with a thin layer of nickel, ranging from 1 to 10 microns thick. The edges of the semiconductors are further coated with a non-conducting insulator to reduce current leakage not progressing through the fin. In a preferred embodiment the coating is a high temperature polymer, such as Tempilaq, manufactured by Air Liquide America Corp. of South Plainfield, N.J. 07080, USA. The sides of the semiconductor are further coated with an additional thickness of nickel of at least 20 microns, preferably 20 to 30 microns.

In a preferred embodiment fins are made of copper. To reduce corrosion and prevent migration of copper into the semiconductor the fins are coated with metal more resistant to oxidation, preferably nickel. In a preferred embodiment the fins are tapered on the opposite end connecting to the semiconductor to allow complete metal filling of the circle. In another preferred embodiment the ends of the hot fins facing the center of the circle are tapered to reduce the likelihood of an electric short caused by fins touching. In another preferred embodiment the end of the fins connecting to the wafers are tapered in the area of contact with the wafer to accommodate ring closure without the use of wedges.

An alternative approach to achieve uniform metal-semiconductor filling of the circle is to have straight ends on the fins and to insert coated copper conductive wedges periodically around the circle. Preferably the copper conductive wedges are coated with nickel and placed in registry with each coupon.

A single insulator is placed in the ring and preferably an additional cold fin with adjacent semiconductor. In a preferred embodiment the insulator is made of mica.

Placing solder between the surfaces of the fins and the semiconductors completes assembly of the thermoelectric device. Preferably prior to assembly solder is applied to both sides of the hot and cold fins at a thickness of between 50 and 100 microns. Kester's solder is preferred but an additional 4% of silver powder needs to be added for optimal performance.

A considerable outward radial force occurs when heat is applied to the hot fins and current flows in the ring. To prevent collapse of the device compressive force needs to be supplied. This is accomplished by tightening a metal strap around the device. To prevent shorting by the metal strap an insulating material is place around the ring before attaching the metal strap. Preferably the insulating wrapping is heat shrinkable polyimide. In another preferred embodiment the steel band is held in compression using one or more Belleville disk spring washers. These allow compression to be retained when the device cools. Non-metallic thermo-stable plastic can be used in lieu of a metal band with electrical insulator.

Prior to assembly each coupon 6 is tested for its thermoelectric activity and electrical conductivity.

A generator ring is assembled using 60 coupons with solder paste in-between adding two additional cold paddles with an insulator in-between. After assembly and application of inward compression by the metal ban the device is heated. In a preferred embodiment the rate of heating is 10 degrees per minute to a temperature of 270 degrees C. The bonded device is then removed and allowed to cool in air. In another preferred embodiment the cold fins are positioned downward so any excess solder drips along the cold fins creating extra surface area for heat exchange.

A variety of controls can improve the utilization of stand-alone and absorption hybrid version of the thermoelectric device. For example, a self-powered climate control system can power the electrical needs of the residence or a commercial building, while also powering the absorption chiller system with generator exhaust heat and a small portion of the generator's electrical production. There will be times when either electrical output or chilling output will be surplus. To make the most economical use of the surplus capacity, an air dryer, which is a machine that wrings water from air can be incorporated. This machine can supply drinking, sanitary and agricultural water for residents and for community uses. Under certain atmospheric conditions, 1,000 gallons a day and more can be harvested from the air, making use of the thermoelectric generator-absorption chiller hybrid, especially during the nighttime, and periods of high humidity. This is also a time when electrical and chilling demands can be lower; so excess capacity can be utilized for water production using any or all of the water production means described.

In a preferred embodiment a micro-controller is set to optimize the production of electricity, heating or chilling or for water harvesting during nighttime hours. The control system consists of a selector knob that is positioned to cause the system to operate within preset limits with fuel economy, low operating cost, and to prioritize chilling capacity during the day, switching to water production during nighttime hours.

What this selector does is tell the micro-controller to concentrate on holding parameters that would enhance the system's operation in the selected mode, holding the operational parameters of the other operations to a looser specification. In other words, if water production is emphasized, and all the other systems will operate at 100 volts AC and the environment is comfortable at 27° C., the system will be adjusted to operate at most economical conditions to produce water and support the other operations with a more relaxed specification.

The generator's control system will seek the lowest fuel burn to maintain a preset voltage level on the bus. This is the most efficient way to operate the generator, to consume the least amount of fuel for electrical production. There are many occasions where the load on the line will increase dramatically and will require the generator to be operating at a much higher fuel burn to support the loading. Because the generator requires a recovery time between the time the increased loading is applied and the time required for the generator come up to the increased output levels of about 30 seconds, the dimming of house lighting will signal the application of increased loading. This is disconcerting to the user. With the utility grid, this is taken care of with spinning reserve at the generation site, and the fact that the grid system is huge and is not easily affected with the switching in of a mere household load. With smaller stand-alone generation, the sudden addition of a significant load causes the house lights to dim for a period until the generator can increase the heating to assume the extra loading at the previous voltage level. One way to instantaneously increase the effective power of the generator is to allow the up-converter controller to switch from producing a sine wave to a square wave. This is done until the heat can be raised in the generator, then the waveform can revert back to the sine wave at the previous voltage. Since the square wave has almost 30% more energy than a sine wave, this is a practical way to make a little generator, operating with maximum fuel efficiency, react in a few microseconds to maintain bus voltage in spite of the increased loading. This waveform change allows the generator to operate as if it has a 30% spinning reserve. This way, it can support the previous load and a load that is 30% higher at constant voltage, until the burn rate can be increased. It can support this loading without allowing the lighting to dim or cause detriment to any of the electrical loads. Another way this feature can be used is to set the generator control system to operate producing only a square wave, and thereby saving 30% of the fuel that would otherwise be consumed in producing a sine wave. The lights may dim but saving 30% on fuel bills may be worth this minor annoyance. The user has clear choices as to how this system operates, the cost of operation, and can decide which is more important.

In another preferred embodiment a programmable microcontroller is installed at the site of each large electric load, such as an electric stove, electrically powered air conditioner, or electric clothes dryer. The programmable microcontroller communicates with the generator to signal that a large load is in the "on" mode. The programmable microcontroller delays the switching on of the appliance until the generator signals to a particular programmable microcontroller that it has increased the fuel burn to accommodate the new loading. When the generator's micro-controller signals the programmable microcontroller that it has increased capacity to assume the load, the programmable microcontroller switches the appliance onto the bus. The generator's control system constantly monitors output capacity and can maintain this extra capacity until the work of the extra loading is completed, then reducing fuel burn to a minimum level to support bus voltage within preset limits. If however, another programmable microcontroller signals to come on line, and the burner is at maximum fuel burn, the generator's micro-controller may delay the start of the new load until another load drops off the bus or there is adequate output capacity available. The programmable microcontroller signals the load size to the generator's controller for this determination. In this way, a small capacity, highly efficient generator can serve the same function as the grid, by delaying the start of certain appliances. Also, certain programmable microcontrollers can be programmed to have higher priority over other programmable microcontrollers, delaying the clothes drying for instance in favor of cooking supper on the stove, resuming the drying operation after a stove is turned off and meal is cooked.

In another preferred embodiment a battery boost allows the system's micro-controller to shut off the generator at night when loading is below a certain load level, only to restart the generator when the batteries drain to a lower and preset safe level. The battery system can be charged with energy from the grid or with electrical energy from the generator. Using the utility grid to charge the battery bank prevents the utility company from abandoning the customer or billing for "Stranded Facilities" when customer runs exclusively on the self-powered generator-absorption chiller hybrid system. Another benefit to the user, should the generator system ever fail, the utility service can be used as if nothing happened, bring in outside energy through the battery charging system. On the other hand, should the utility system fail, the generator can support the residence or commercial building as if there no power failure ever occurred, automatically and without disconnects or switchovers. This will provide the user with seven 9s reliability, up from the standard four 9s reliability realized with grid only service. This is why it is important for the customer to remaining connected to the grid when available. By using the grid only for charging the battery bank, not only are the batteries maintained, the residence or commercial building will realize a source of emergency power for a small monthly minimum charge, and the facility will have the seven 9s reliability required for dependable computer operation.

The above described inventions and implementations illustrate the broad range of uses of the improved thermoelectric device and its hybrid versions. In addition there are may other implementations which utilize the valuable properties of these inventions including efficiency, low noise and portability.

In a preferred embodiment a smaller version of the thermoelectric device described in detail herein is made to be a backpack generator. By providing 120 and 240 volts AC output the backpack can be used with any tool or device which would otherwise require proximity to an electric outlet or portable liquid-fuel stand-alone generator.

In another preferred embodiment a thermoelectric device as illustrated and claimed herein is combined with the mechanical portion of a tool producing a thermoelectric tool. Examples include but are not limited to a chainsaw, circular saw, reciprocating saw, drill, posthole digger, and automatic nail driver.

In a preferred embodiment the thermoelectric device claimed herein is combined with a mechanical compressor and air storage chamber to provide a portable, quiet and efficient air compressor system.

In another preferred embodiment a small thermoelectric device is fitted to replace batteries in battery powered hand tool systems, especially those that use a common battery size and shape to power a variety of different tools and electronics. In another preferred embodiment standard propane tanks are used as fuel for a small thermoelectric generator having a DC output that matches the voltage needed for battery driven tools.

In another preferred embodiment a small thermoelectric device is designed to be affixed commonly to mechanical portions of common hand tools. In one case the electrical output drives an electric motor used to power the mechanical portion of the tool. The benefit of having a hybrid tool is to allow the energy demand of the tool to control the fuel consumption rate by direct feedback.

In addition to thermoelectric tools the thermoelectric device disclosed here can replace other means of supplying energy to appliances. This a thermoelectric device can be used to power a refrigeration compressor in a common household refrigerator or freezer. Similarly an electric stove can be powered by gas or liquid fuel by utilizing a thermoelectric device. Such appliances fitted to burn wood would be especially useful in remote areas where wood is abundant and electricity is not present. As with thermoelectric tools thermoelectric appliances have the benefit of allowing feedback to control the rate of combustion.

In another preferred embodiment a thermoelectric powered absorption chiller and water harvesting machine is designed to be affixed to the outside of an apartment, townhouse, condo or the floor of an office building to provide electricity, climate control and water independent of the buildings services, needing only a fuel supply. Such a system will make retrofit of existing facilities easier providing an alternative to high cost, unreliable utilities and nuclear source power in Europe and elsewhere in the world.

A major benefit of the inventions described herein is the improvement of transportation means. Transportation vehicles can be manufactured with a thermoelectric generator driving one or more motors to propel the vehicle. The thermoelectric generator can be powered by fuel combustion or by heat transferred from the thermal store, or a combination of both heating sources. In some cases vehicles can be retrofitted with a thermoelectric generator and when necessary a motor and means to transfer energy from the motor to the propulsion system. A third system can be used in some cases to take advantage of thermoelectric propulsion without retrofitting. In this case an integrated combination of thermoelectric generator, motor and drive mechanism is secured to a trailer and the trailer attached to the vehicle to provide propulsion to the vehicle.

Figure 37:
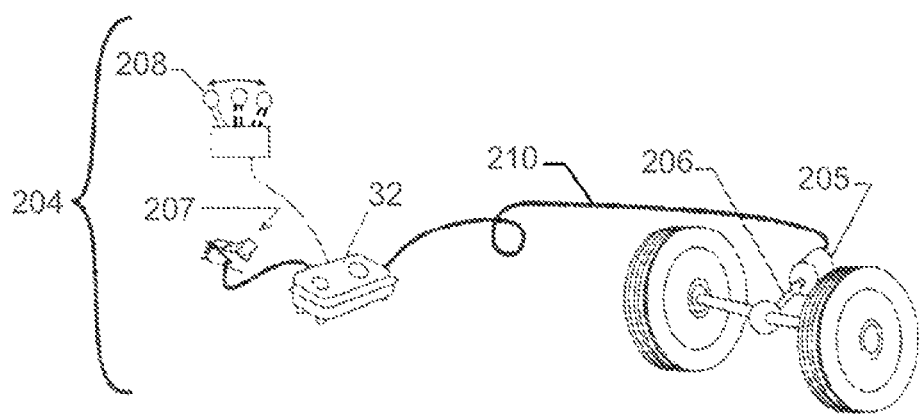
FIG. 37 illustrates the use of a high efficiency thermoelectric generator device to power an electric motor that connects to the drive shaft of an automobile.

Thermoelectric generator devices can be used in a wide variety of applications. For example a set of components 204 in FIG. 37 can be used in an automobile that has a failed engine. An automobile can be powered using a fuel burning three phase thermoelectric generator 32 by removing the old engine and transmission and adding a single electric motor 205 connected directly to a special drive shaft 206. FIG. 37 illustrates the use of a high efficiency thermoelectric generator 32 to power an electric motor 205 that connects to the special drive shaft 206 of an automobile. The speed of the electric motor 205 is regulated by a standard accelerator pedal 207 that now controls the frequency of the electrical output from the thermoelectric generator 32. The rotation direction of the electric motor 205 and correspondingly the wheels of a vehicle is controlled by a standard car shifter 208 modified to cause phase shift in electricity produced by the thermoelectric generator 32 for forward, neutral and reverse vehicle travel directions.

Figure 38:
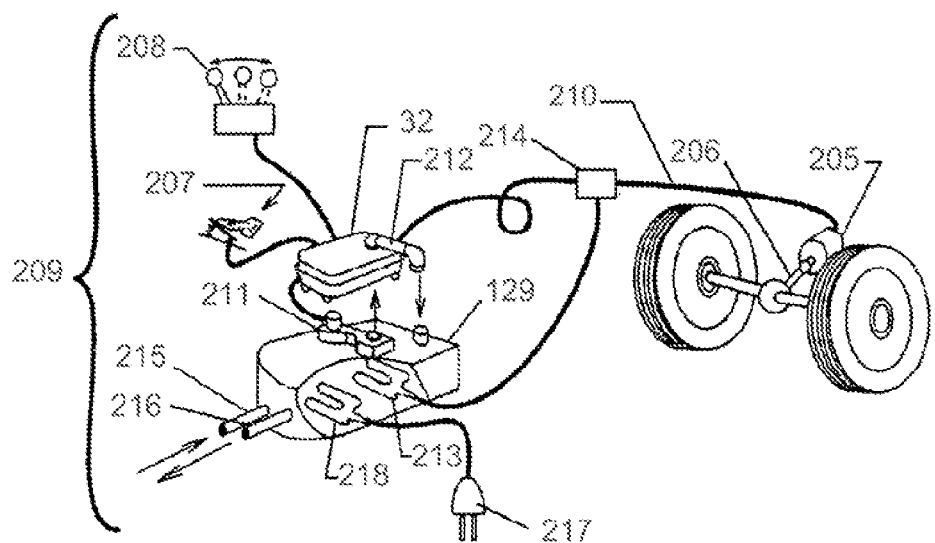
FIG. 38 illustrates the use of heat stored in ceramic fragments to drive a conveyance using a thermoelectric generator wherein wheel braking energy is conserved using resistance heating in the heat store.

FIG. 38 illustrates one configuration 209 for using heat stored in ceramic fragments to drive a vehicle using a thermoelectric generator 32. A significant feature of this system is energy recovery while braking a vehicle. This energy recovery is done by shunting energy produced by the armature of the electric motor 205 to a resistive heater 213 in a heat store 129, depicted in FIG. 25 and described in greater detail below. A control box 214 senses over-voltage on a motor power bus 210 interconnecting the thermoelectric generator 32 with the electric motor 205. Over-voltage on the motor power bus 210 indicates braking by the automobile's hydraulic brake system and causes the shunting of the excess energy to the resistive heater 213. The car then brakes in a forceful and safe manner regulated by control box 214 and the automobile's conventional breaking system. Analogous to the resistive heater 213, the heat store 129 may also advantageously include a second heating element 218 for storing thermal energy in the heat store 129 by connecting the heating element 218 to an electrical utility grid through an electrical plug 217.

Figure 39:
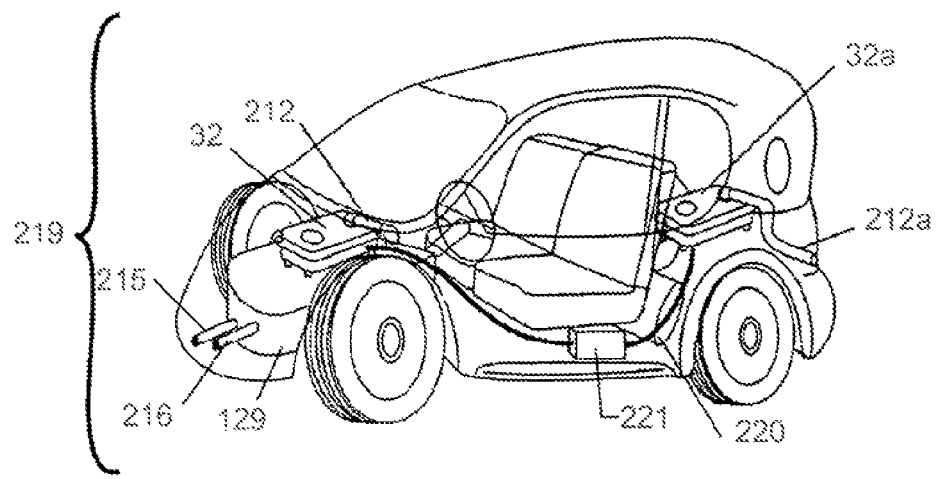
FIG. 39 illustrates a hybrid vehicle having both a heat reservoir source and dedicated thermoelectric generator and in addition a second thermoelectric generator that burns liquid fuel.

An alternative implementation depicted in FIG. 39 is a hybrid vehicle 219 that includes both a heat store 129 together with a primary thermoelectric generator 32 and an auxiliary thermoelectric generator 32a that preferably burns liquid fuel drawn from a vehicle's original fuel tank 220. The hybrid vehicle 219 includes the same resistance-braking feature as the configuration 209. Preferred operating method for the hybrid vehicle 219 initially uses solar heat energy drawn from the heat store 129, and subsequently the supplemental fuel drawn from the fuel tank 220. Under circumstances in which more energy is needed than the heat store 129 can supply, a controller unit 221 is engaged to synchronize electrical output from both of the thermoelectric generators 32, 32a. Electrical output synchronization is accomplished using methodology described in U.S. Pat. No. 8,101,846 that is hereby incorporated by reference as though fully set forth here. When the hybrid vehicle 219 operates drawing maximum power from the heat store 129 and the primary thermoelectric generator 32, determined from full extension of the accelerator pedal 207, the controller unit 221 activates the auxiliary thermoelectric generator 32a that operates on fuel drawn from the fuel tank 220. The auxiliary thermoelectric generator 32 comes on line to assume the extra load increasing power for driving the hybrid vehicle 219. For AC drive applications, phase synchronization between thermoelectric generators 32 is achieved through controller unit 221 phasing electrical power generated by the primary thermoelectric generator 32 to conform to the exact phase of electrical power generated the auxiliary thermoelectric generator 32. When load demand of the hybrid vehicle 219 decreases, the controller unit 221 commands the auxiliary thermoelectric generator 32 to stand at the ready or the auxiliary thermoelectric generator 32 can be shut down until needed again.

Examples of the land transportation vehicles that can be manufactured and powered by one or more thermoelectric generators, one or more electric motors and one or more drive shafts include: passenger cars, pick-up trucks; highway cargo trucks, farm tractors, trains; bicycles including motor bike styles; motor cycles; and construction equipment such as graders, bull dozers, back hoes, cranes, construction hauling trucks, and the like.

Many existing land vehicles can be retrofitted to replace traditional power system with a thermoelectric power system. For example, the combustion motor and transmission of a car or truck can be removed from the vehicle and replaced by one or more thermoelectric generators driving one or more electric motors that connect to the drive shaft of the vehicle. In a preferred embodiment thermoelectric generators power electric hub-motors embedded in the vehicle's wheels.

In a preferred embodiment some land vehicles benefit from thermoelectric power without modification of the vehicle. In one implementation one or more thermoelectric generators powers one or more motors that power a trailer. The trailer is connected to the vehicle in a fashion to push the vehicle. In this implementation the vehicle being pushed runs on minimal power needed for power controls, air conditioning, lighting, braking and the like. The trailer can be either two wheeled, or four wheeled.

In another preferred embodiment trailer hauling trucks are adapted to connect to cargo trailers each of which is powered by one or more thermoelectric generators driving one or more motors directly driving wheels of the trailer. Thus one truck can haul many trailers forming a land train to be used in places where land trains normally operate.

Examples of water transportation vehicles that can be manufactured and powered by one or more thermoelectric generators, one or more electric motors and one or more drive shafts include: pleasure motor craft; house boats; jet skies; sail boats; tug boats; ocean liners, and cargo ships.

Pleasure motor craft, houseboats and sailboats powered by inboard motors can be retrofitted in a manner similar to that applied to vehicles. The inboard motor is replaced by one or more thermoelectric generators and these generators drive one or more electric motors connected directly or indirectly to propellers. Cargo and other ocean going vessels can be retrofitted by replacing boilers and combustion engine drive systems to thermoelectric drive systems by appropriate sizing of the number of thermoelectric generators and drive motors to the power needs of the vessel.

Figure 25:
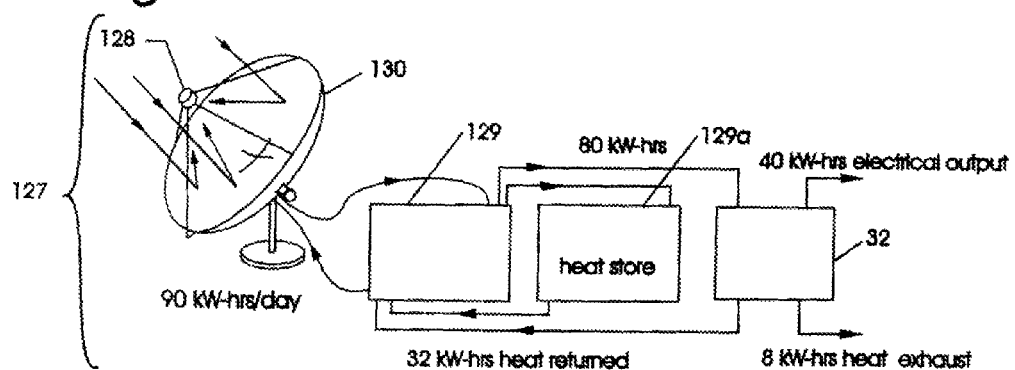
FIG. 25 illustrates a closed circuit solar collecting system that focuses solar heat on a target and transfers heat to a store that is then used to operate a generator.

Several newly manufactured and some retrofitted vehicles of the type depicted in FIGS. 37-39 can benefit by using stored solar energy. FIG. 25 illustrates a closed circuit solar collecting system 127 that focuses solar heat onto a heat receiving target 128 for heating gas or air that circulates through a heat store 129 which contains a heat storage medium such as dolomite fragments or preferably porcelain fragments. A thermoelectric generator 32 that operates as needed can be energized by stored heat obtained from the sun as follows. A two-axis solar-tracking heat collector 130 receives solar radiation and focuses that heat energy onto the target 128. Hot gas or air flows from the target 128 through a primary heat store 129 to increase the working temperature of the heat storage medium present there before the gas or air re-circulates to the target 128 for further heating. Subsequently, thermal energy present in heat store 129 can be used as needed to operate a thermoelectric generator 32. FIG. 25 indicates how thermal energy can first be transferred using circulating gas or air to heat storage medium medium present in the primary heat store 129. The illustration of FIG. 25 also includes an auxiliary heat store 129a to provide additional heat storage capacity which in principle could be the heat store 129 depicted in FIG. 38 that stores heat used for vehicle operation. When thermal energy is being stored before operating a vehicle, as depicted in FIG. 38 hot gas or air driven by a fan, not depicted in FIG. 25 or 37-39, enters the heat store 129 of the configuration 209 via an insulated input line 215, circulates through the heat storage medium present in that heat store 129 and then flows back to a heat source such as the heat store 129 depicted in FIG. 25, or even the target 128, via an insulated output line 216. When the vehicle depicted in FIG. 38 operates, a blower 211 moves hot gas or air from the heat store 129 to the thermoelectric generator 32 from which the gas or air returns to the heat store 129 via an insulated return line 212. The amount of heat transferred from solar collector to heat store 129 depicted in FIG. 25 during a typical summer day has been determined from a temperature rise of a heat storage media mass of 545 kg during one day. The storage media tested consisted of dolomite fragments having a specific heat of 1.7 J/(kg×° C.). Specific heat was determined by calorimeter methodology as measured in the 500 to 800° C. temperature range. Typically, without any heat being drawn from the heat store 129 90 kW/day is deposited into the heat store 129 increasing storage medium temperature from 400° C. to 900° C. The amount of heat loss is determined by measuring the temperature drop of the closed heat store 129 over time. Properly insulated, the half-life of the heat store 129 operating near 900° C. is approximately a week and more. The electrical energy output produced by a thermoelectric generator 32 operating with the heat store 129 between 400° C. and 900° C. is determined to be 5 kW for an 8-hour period while applied to a resistive load. Wattage was verified with Volt and Amp meters over the 8-hour period for a total loading of 40 kW-hr. Thermal energy supplied to the thermoelectric generator 32 from the heat store 129 was determined by measuring inlet/outlet temperatures for gas flowing in and out of the thermoelectric generator 32. Measured in/out gas temperatures were 620° C. at the inlet to the thermoelectric generator 32 and 418° C. at the outlet from the thermoelectric generator 32 for gas or air returning from the thermoelectric generator 32 to the heat store 129. With generator electrical output measured correctly, generator input energy equates to 80 kW-hrs of heat energy used in the generator while 32 kW-hrs of unused energy is returned to the heat store 129. Based on measured in/out gas temperatures for the thermoelectric generator 32 and measured generator electrical output, the amount of heat dissipated from the cold fins 3 was 8 kW-hrs.

Figure 26:
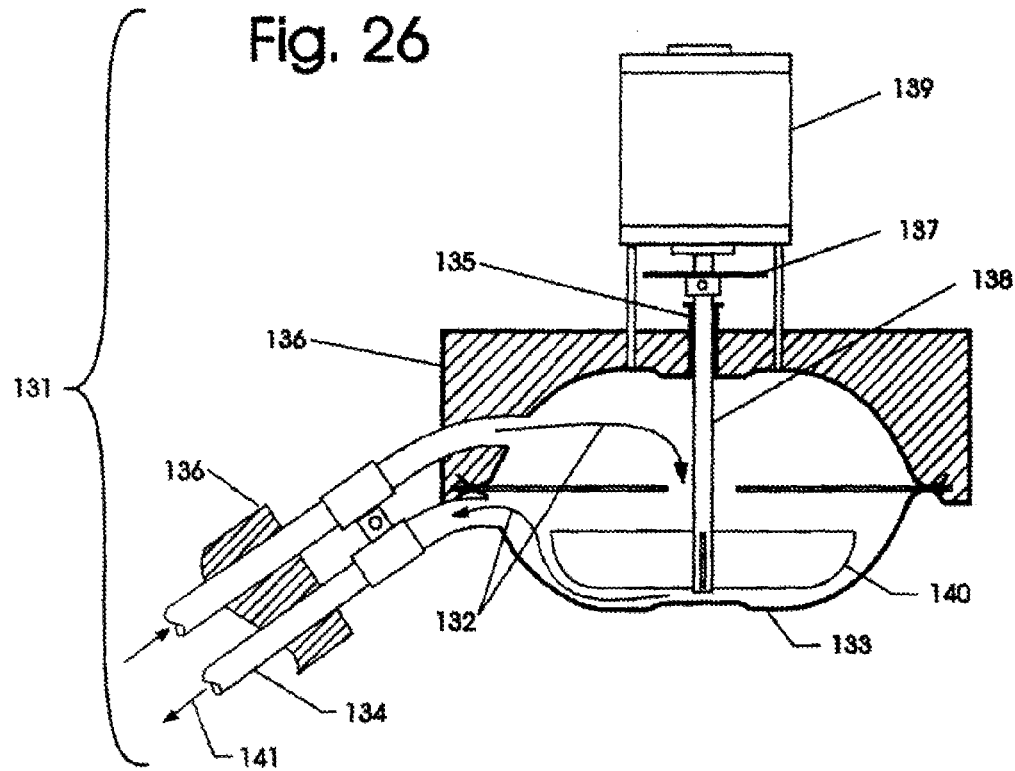
FIG. 26 illustrates a motorized target system that stirs gas and transfers heat to a store.

FIG. 26 illustrates a motorized target system 131 that stirs gas 132 repeatedly over the heated surface of the target 133 exhausting heated gas under centrifugal pressure into hot air return pipe 134. Labyrinth seal 135 equalizes closed system pressure with that of the ambient during times of gas flow shut down and start up. In normal operation, no gas passes through this seal except to equalize pressure between atmosphere and system. Insulation 136 covers the top portion of the target and the supply lines to reduce heat loss in the direction of the sun and during nighttime, minimizing hot gas siphoning from store to target and back from occurring. Cooling disc 137 reduces heat flow through driveshaft 138 that would otherwise shorten the life of motor 139. System gas 132 is heated by focused heat from the sun that is directed on the target. Gas is moved across heated surface by impeller 140 rotated by motor 139 using system gas 132 circulated through heat store 129. Motor speed controls gas velocity through heat store 129. When the motor is stopped, system gas circulation stops except for minor thermal siphoning between target and heat store clue to heat loss of target heating surface 133. The target motor normally operates at a speed to control the gas exiting the target in the range of 800 to 1,000° C. When out flowing gas 141 from target 131 exceeds 1200° C., tracking system is accelerated to move focused heat off target until gas flow caused by target motor 139 running full speed can reduce the gas outlet stream below 1200° C. preventing target melt. When the gas 141 flowing out of the target reduces below 1200° C. the tracking is returned to the normal operation of pointing towards the sun. The heat store provides round-the-clock thermal energy to produce electric power especially at night and when the solar collector is obscured by clouds.

Figure 27:
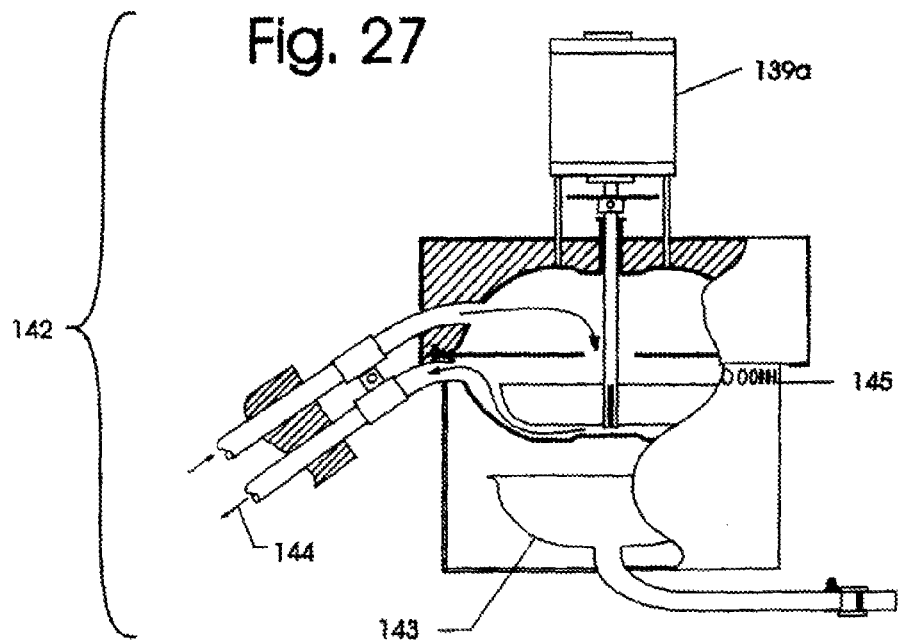
FIG. 27 illustrates a supplemental means for heating the heat store during overcast days.

FIG. 27 illustrates a supplemental means 142 for heating the heat store 129 by adding a heat store burner 143 to the energy system 127. Exhaust gas from burner 143 exits burner 143 at openings 145. Heated gas 144 exits 142 to circulate through heat store 129. Motor 139a and burner 143 operate together to inject heated gas 144 into the heat store 129 as needed, shutting off when supplemental heat in the store is not needed. Supplemental heating is necessary when days are short, heat store 129 is sized too small and during overcast prevalence. In a preferred embodiment the temperature of combustion gas is increase by forcing air into the combustion chamber.

Figure 28:
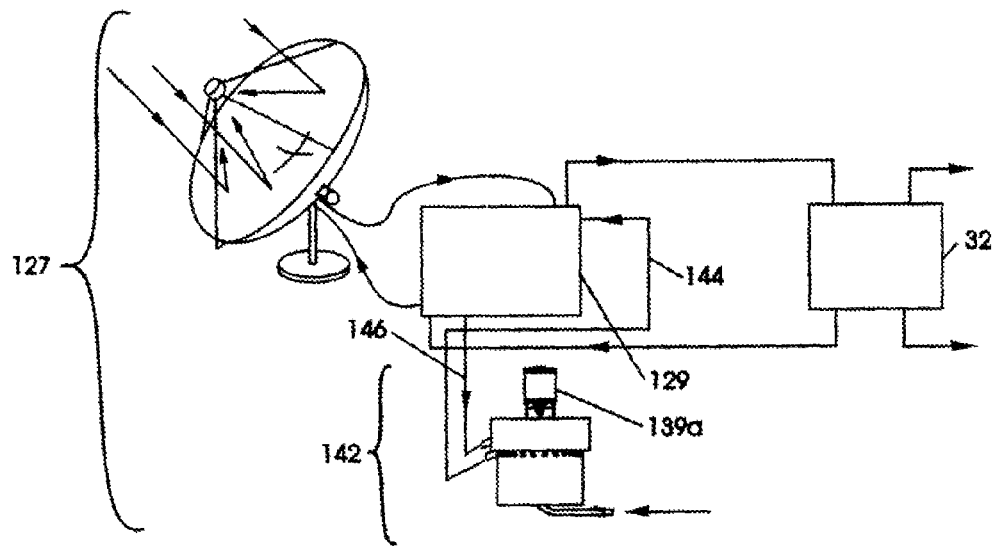
FIG. 28 illustrates how a supplemental heating means is connected to heat store.

FIG. 28 illustrates the use of supplemental heating 142 as a means to rapidly increase the temperature of a heat store that normally is heated only by solar energy. Device 142 of FIG. 27 is connected to heat store 129 of FIG. 25, of energy system 127 in a manner that makes supplemental heating instantly available without waiting for the heat store 129 to increase in temperature. Heated gas 144 from 142 circulates by motor 139a to pass through heat store in the reverse direction of gas that is used by the generator 32. This allows generator 32 to draw gas heated by burner 143 without waiting for the heat store 129 to rise in temperature.

Figure 29:
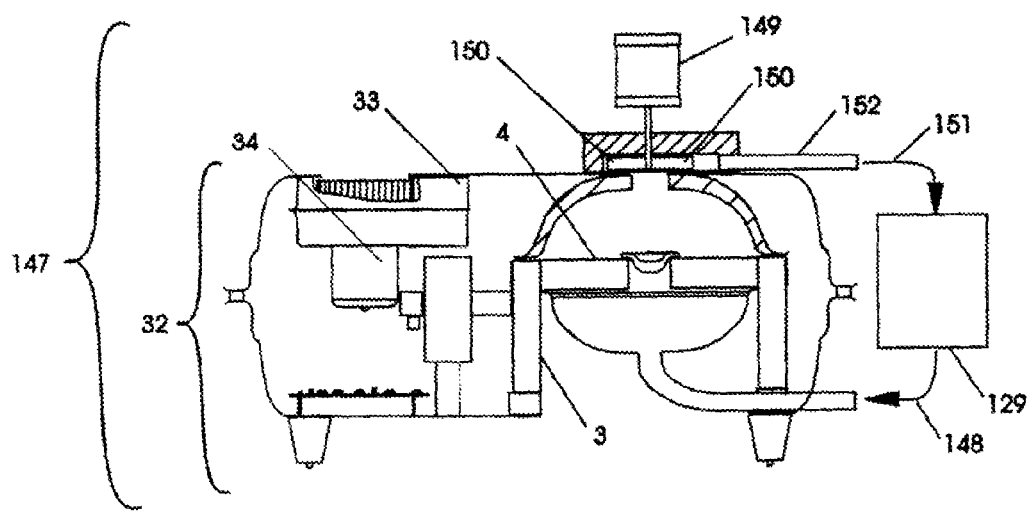
FIG. 29 illustrates a means of circulating heated gas from a heat store through a thermoelectric generator.

FIG. 29 illustrates a device 147 for circulating heated gas or air 148 from heat store 129 through electric generator 32 of FIG. 7. A motorized fan 149 with impeller 150 is added to the generator 32 to draw heated system gas 148 from the heat store 129, discharging gas 151 back to the heat store through supply tube 152 of the closed system. A separate air blower 33 powered by motor 34 is used to move cooling air across cold fins 3 of the generator 32 exhausting the heat from cold fins to ambient air. The speed of the fan motor 149 with impeller 150 determines the velocity of hot gas passing across hot fins 4 in the closed system thereby determining the amount of electrical output that is possible from the modified generator 32 in 147. Example 2 lists various power-outputs versus the thermoelectric voltage of individual thermoelectric elements caused by heat flow across thermoelectric elements 4 due to the speed of motorized fan 149. When electrical energy needs are low, motorized fan 149 speed can be low to reduce heat loss through the generator conserving heat energy in the heat store 129. When there are no electrical energy requirements, motorized fan 149 is stopped preventing gas flow through the generator 34.

Figure 30:
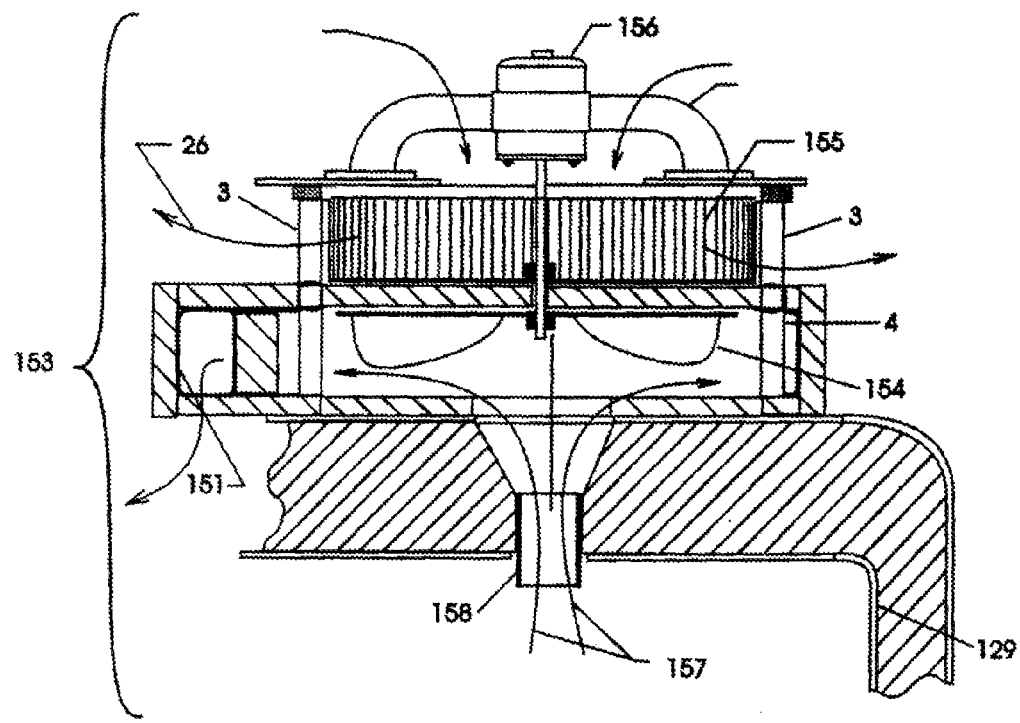
FIG. 30 shows a thermoelectric generator that uses vertical fins with built-in fans that is mounted onto a heat store.

FIG. 30 shows a thermoelectric generator 153 that uses vertical fins 4 for heating and vertical fins 3 for cooling with built-in fans 154 for circulating hot air and 155 for cooling fins 3 driven by a single motor 156. Generator 153 is shown mounted directly on the insulated heat store 129 with hot air 157 passing through generator 153 returning hot air 157 to heat store 129 for re-heating through duct 151. The hot gas 157 through hot gas inlet 158 to the generator 153 is located adjacent to where the hot gas coming from the target output heated gas 144 is located so the generator can be operated with incoming solar heated gas, supplemented by heater 142. The advantage being the generator is instantly operational without having to wait several days after initial installation for the heat store's large mass to be heated above 500C.

Figure 31:
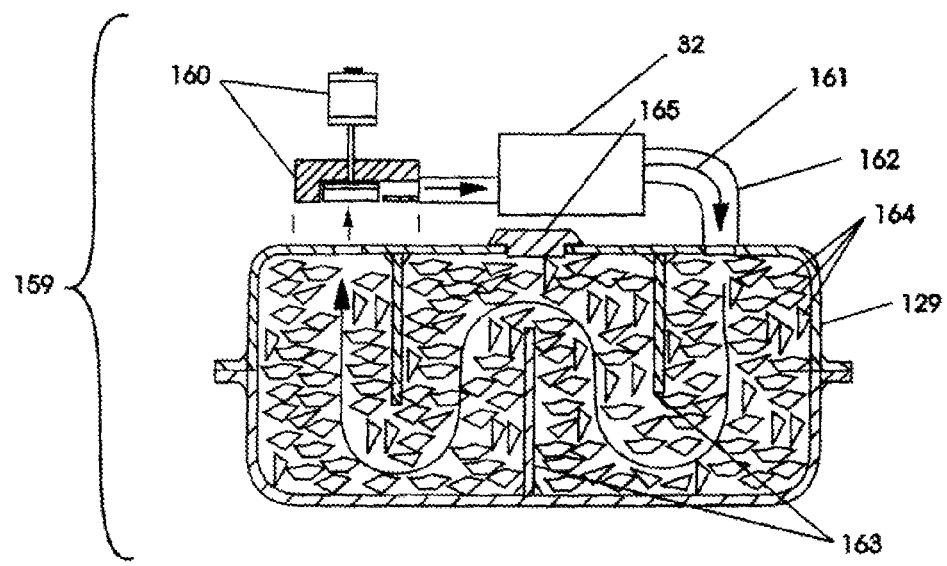
FIG. 31 illustrates a gas flow system through an insulated heat store with baffles and insulated cover.

FIG. 31 illustrates a gas flow system 159 with heat store 129. Motorized fan 160 circulates gas from heat store 129 through generator 32, the exhaust 161 returning through duct 162 delivered to the other end of heat store 129 for re-heating. Baffles 163 in heat store 129 direct circulated hot gas 161 through heat storage media 164 in heat store 129. Insulated cover 165 for heat store 129 is shown as a means of filling store with heat-storing media 164.

Figure 32:
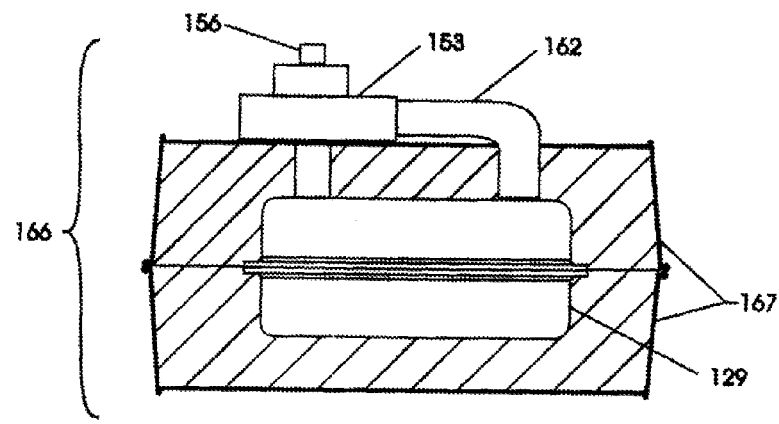
FIG. 32 illustrates an insulated heat store system with attached generator.

FIG. 32 illustrates an insulated heat storage system 166 that comprises generator 153 of FIG. 30 mounted directly on insulation over heat store 129. This generator 153 uses a single motor 156 to power a fan for heat circulation that returns exhaust through duct 162 and delivers it to heat store 129. The same motor 156 drives another fan that provides cooling for generator's cold fins. Insulated cover 167 over heat store 129 maintains storage temperature starting at 900° C. and ending at 500° C. for a half-life of weeks and at the same time provides environmental protection. The insulation is made of ceramic fiber blankets of alumina-silica fiber bonded with a resin that can withstand temperatures up to 1150 C. The heat flow rate of this material is listed as 0.5 Btu/hr×inches per square foot at 400° C.

Figure 33:
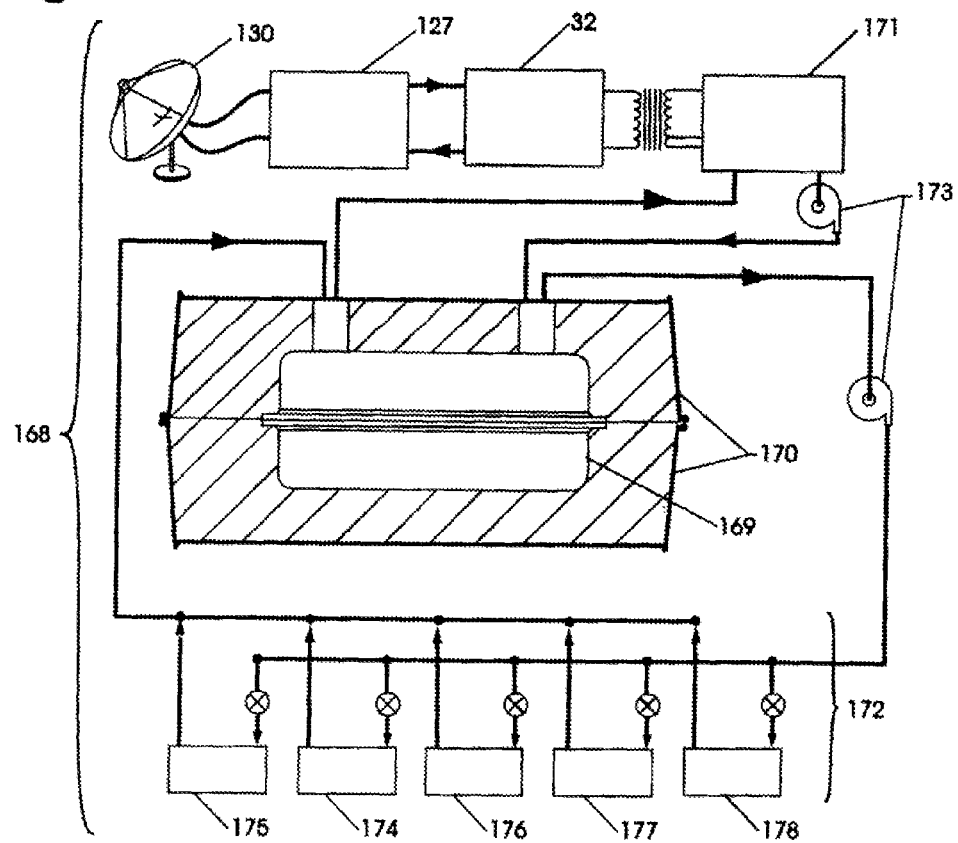
FIG. 33 illustrates a system comprising heat store operating with a thermoelectric generator electrically powering a solid state chiller and operating appliances in a closed system.

FIG. 33 illustrates a solar powered thermoelectric cooling system 168. It comprises a solar collector 130, a solar-powered cold store 169, a heat storage unit 127, a thermoelectric generator 32, and an electrically powered solid state chiller 171. The solid state chiller is a generator of type 32 configured as device 147. It is operated as a chiller by moving heat from a cold store 169 enclosed in insulation and case 170 and thereby providing refrigeration through pumps 173 to refrigeration appliances. Gas circulation between chiller and cold store is caused to circulate chilled gas by motor driven blower 173 pumping gas or air between the chiller unit and the cold store. A solid state chiller 171 is made from a thermoelectric generator 32 by provision of DC electrical current from thermoelectric generator 32 to circulate in ring 7 of FIG. 4. The current circulation drags with it heat from one set of fins to another set depending on the direction of the DC electrical current. FIG. 33 illustrates various ways a cold store may be used to operate different appliances by circulating chilled air or gas in a closed loop with individual valves 172. Refrigeration can be accomplished using chilled gas-to-gas, chilled liquid-togas and chilled vas-to-liquid heat exchangers not shown. Appliances such as air conditioner 174, fresh water from brine by ice making machine 175, atmospheric water harvesting machine 176, refrigerator 177, and freezing machine 173, are examples. Heat removed from a cold store 169 can be drawn out at night when electrical loads on the thermoelectric generator are low. The cold store can be operated daytime or nighttime for air conditioning, refrigeration, and freezing when electric generator loading is high. The purpose of the cold store system 168 is a shedding of generator electrical loading during daytime when electric loads are high, shifting loads to the nighttime to balance generator electrical loading around the clock. Load balancing allows the use of a much smaller electric generator than would otherwise be required without a cold store system 168. In another preferred embodiment chiller 171 is an absorption chiller where electrical energy from the thermoelectric generator drives the chiller through resistance heating the same manner as the absorption chiller would operate from electrical grid source.

Figure 34:
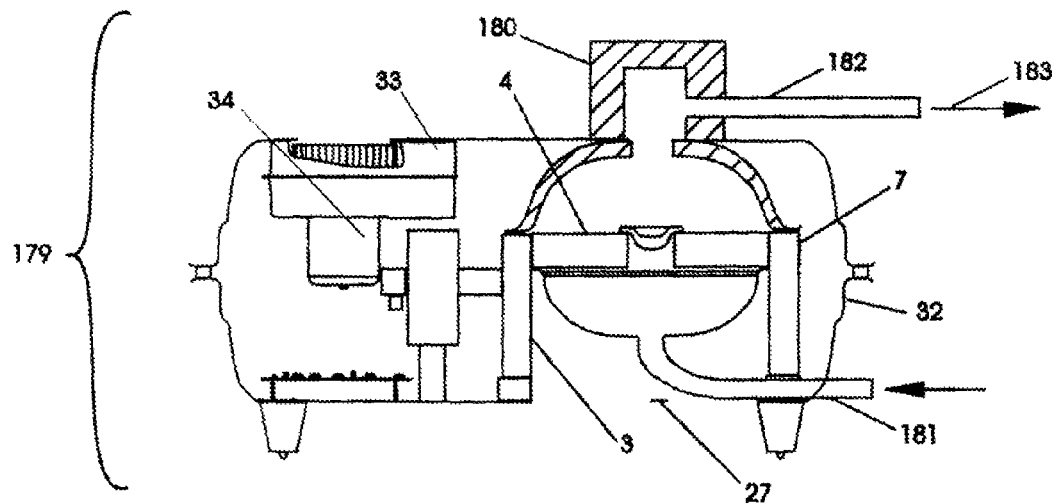
FIG. 34 illustrates a method of converting standard thermoelectric generator to operate with hot gas as a generator or as a chiller cooling a gas stream when current is circulated in the ring.

FIG. 34 illustrates a device 179 that allows a simple conversion of a standard thermoelectric generator 32 to operate as a chiller. Cold store 169 is cooled through fins 4 as a closed gas system using plenum 180. DC voltage is applied through upconverter 36 operated as a down-converter. Chilled gas from cold store 169 is drawn in through tube 181, passes over fins 4, through plenum 180 and exits tube 182 returning lower temperature gas 183 to cold store 169 in FIG. 33 as a closed system. Heat produced on fins 3 of the chiller device is expelled by ambient air by motor 34 and blower 33 passing ambient air over fins 3 exhausting heat below the chiller through outlet 27.

Figure 35:
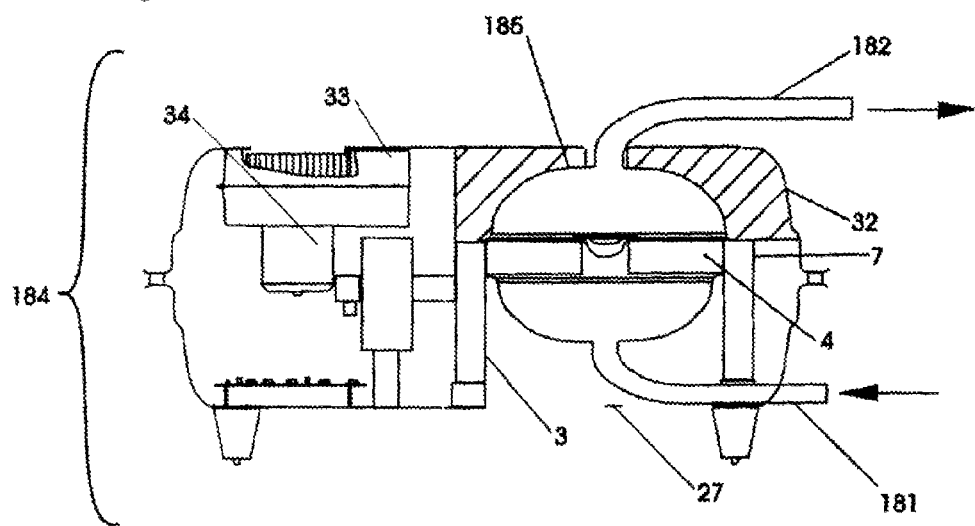
FIG. 35 illustrates a conversion method that allows for standard thermoelectric generators to operate with hot gas as a generator or as a chiller to chill a gas stream when current is circulated in the ring.

FIG. 35 illustrates another conversion method to make a chiller 184 from a thermoelectric generator. A standard thermoelectric generator 32 is operated as a chiller in the same manner as chiller device 179 namely providing DC current to the ring. This chiller operates to draw chilled gas from cold store 169 through tube 181, the gas passing over fins 4, through insulated dome 185 through exhaust tube 182 and returned at a lower temperature to cold store 169 as a closed system. A fan, not shown, is used to circulate air through chiller and cold store as a closed system. Heat from the chiller produced at fins 3 is expelled by ambient air driven by motor 34 and blower 33 passing this air over fins 3 exhausting to ambient below the chiller through outlet 27. In a preferred embodiment a defective or damaged thermoelectric generator having a damaged or failed coupon is converted to a thermoelectric chiller by welding or brazing a current bypass around the failed coupon.

Figure 36:
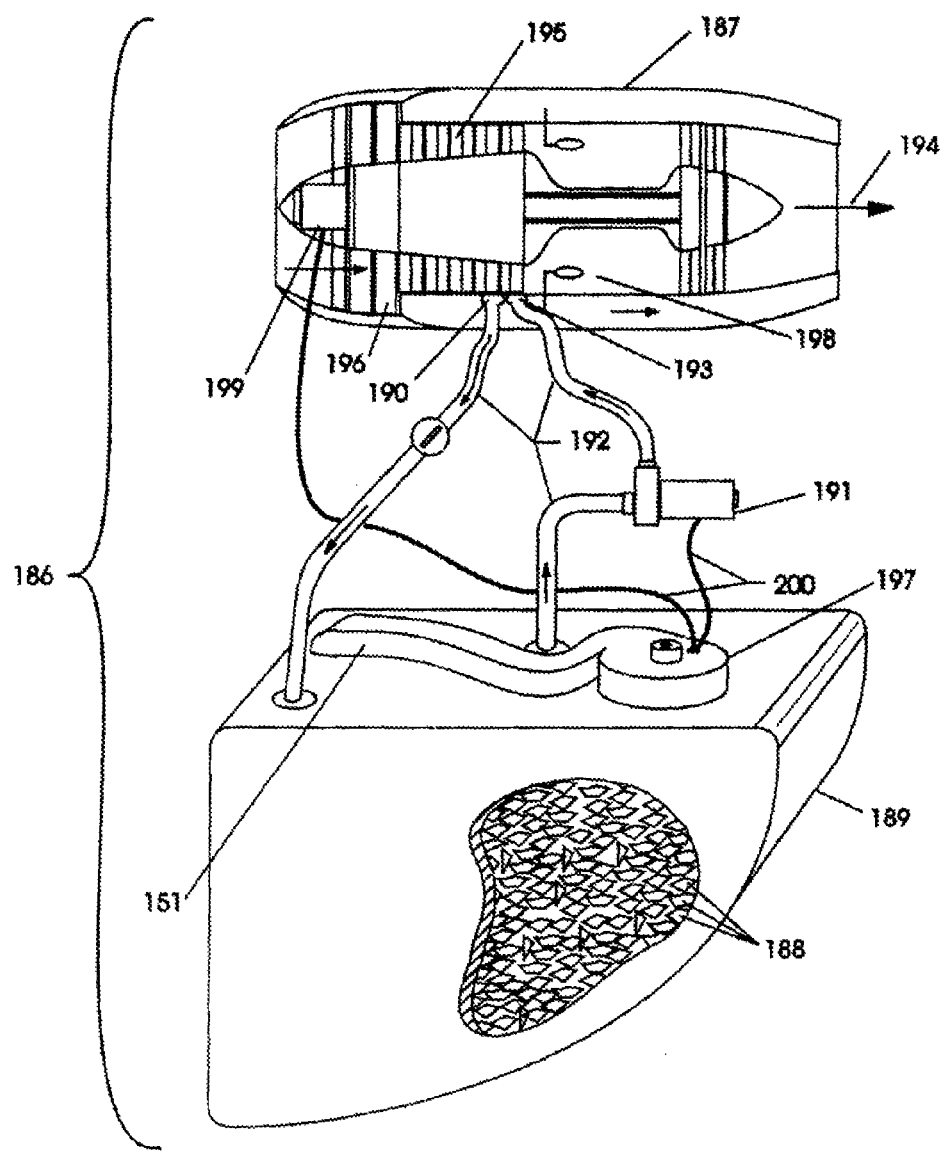
FIG. 36 illustrates a means of solar powering a fanjet engine with a solar heated ceramic fragment heat store.

FIG. 36 illustrates a solar powered fanjet engine 186 for air transport. A fanjet aircraft engine 187 is modified to operate with a solar heated mass of ceramic fragments 188, with very high specific heat. By operating the insulated container 189 between 400° C. and 1,000° C., the energy volume of the store is the same as that of JP-4 fuel. The store can be charged by closed loop air circulation between the store 188 that powers the fanjet and a much larger store that is solar charged and located near the boarding ramp. In use, bleed air 190 from the engine, is further heated by a pass through the heat store 188 and is turbo-injected by turbo-pump 191 through transfer system 192 into the last compressor stage 193 to produced engine thrust 194. The injected heated bleed air exhausting 193, mixes with air coming out of the engine's compressor 195, producing the same expansion as if fuel were combusted with compressor stage air. Detailed calculations indicate that solar heated air from an insulated onboard heat store 188, 189 can exactly substitute for the heat of fuel combustion to produce the same or greater engine thrust 194 as the same volume of JP-4 fuel. Heated gas circulated through the heat store can also power a thermoelectric generator 197 to electrically drive the bypass fan 196, the engine's compressor stage 195, and an electric turbo-pump 191. The turbo-pump moves heated bleed air from one bleed stage 190, through the heat store 188, and injects back into the compressor stage 193 near the combustion section 198. System 186 substitutes hot air derived from the sun for jet fuel that is normally used for flight. FIG. 36, 186 illustrates a theoretical propulsion engine 187 immersed in a uniform flow field associated with jet-propulsion engines. An insulated ceramic fragment heat store 188, 189 and transfer system 192 retrofits a standard turbofan engine 187. The heat stored in the insulated container 189, located within the aircraft's baggage hold, is utilized for reheating approximately 25% bleed air from the compressor stage 195 to an outlet temperature of 1000° C. This heated bleed air is turbo-pumped 191 back into the fanjet engine 187 into the last compressor stage 193 just before combustion chamber 198. Heated, compressed air is injected into the engine, mixing with compressor air flowing through the engine to realize a combined temperature after mixing near that of combusted JP-4. The basic difference in operating principles of a ceramic fragment heated transfer system and that of a JP-4 combustion-heated engine gas is the substitution of compressed, ceramic-heated air to create thrust. The engine's compressor and fan stage can be spun more efficiently using electric motor 199 for power. In normal JP-4 fuel operation, 25% of the gas exiting the tailpipe is combustion product. With hot air operation, roughly 25% of gas passing through the compressor stage is heated by ceramic heat store, then used to expand the remaining compressor air. Part of this expansion normally powers the compressor and bypass fan, which creates engine thrust. Because the temperature of the mixture is carefully controlled, the 10% bleed of compressor air normally needed for hot stage turbine cooling is not necessary. Another advantage of using the heat store is the ability to operate a thermal-to-electric system 197. This system is capable of electrically powering the fan and compressor shaft using stored heat and motor 199. An electric powered turbo-compressor 191 removes air from the heat store then pumps the heated air back into the engine. Because up to 400-hp of electric power is available using the thermoelectric generator 197, electrical energy can be used as needed to push hot air to a location near the combustion chamber. Excess electrical power can be used to drive the turbine engine as a hybrid. An electric motor 199, mounted at the front of engine 187 can help to drive both the compressor section 195 and the bypass fan 196, powered by thermoelectric generator 197 through electric bus 200. The effect of driving the bypass fan and compressor stage of the turbine is a marked increase in engine thrust 194 due to the increased velocity of the exhaust jet. With this engine conversion, the aircraft will have zero combustion noise operating on heated air. There will be no contrails in the upper atmosphere contributing to Global Dimming. There will be no carbon emissions contributing to Global Warming.

In another preferred embodiment a thermoelectric generator can be made into a thermoelectric chiller by putting DC current across the insulator. When this is clone one set of fins gets hotter and the other set gets colder depending on the polarity of the DC input. By enclosing each set of fins in a closed chamber one of these chambers can be used to chill fluid, air, or gas, while the other chamber can be used to heat fluid, air or gas. Such an arrangement can be used for desalination in an energy efficient system that freezes pure water from salt water or brine. The heat of fusion in the melting of ice is the major use of electrical energy. This energy is conserved when the energy is used to thaw ice contributing to the freezing of salt water in the separation of fresh water from seawater.

In another preferred embodiment a two chamber chiller thermoelectric device is fitted with two closed chambers to operate as a water freezing desalinization system. Both chambers are fitted with inflow and outflow lines which each have flow switches to send or receive water from a fresh water harvesting reservoir and a salt water reservoir. Initially one chamber is filled with fresh water and the other with salt water by pumping solution from one or the other sources. Then the chiller is energized with electrical current to cause water to freeze in the salt water chamber. As freezing takes place salt water at ambient temperature is flushed through the chamber being heated. After a considerable amount of ice forms in the freezing chamber excess salt-enriched fluid is flushed to waste and the residual ice rinsed with a small amount of fresh water. Then the ice containing chamber is filled with fresh water and ambient temperature salt water fills the other chamber. The second cycle reverses the freezing action such that ice forms in the chamber that was previously heating ambient temperature flushed salt water. At the same time heat being supplied to the other chamber now causes the ice to melt. Because the temperature in the ice melting chamber stays near zero degrees the temperature of the solution in the other chamber becomes much lower than that utilized in the original cycle. When all the ice has been melted that was frozen in the first cycle the process used for the second cycle is repeated, except that this time the fresh water originally formed as ice is emptied to a fresh water reservoir before being replaced by more salt water. The chamber that had ice formed is emptied of concentrated salt water and rinsed with a small amount of fresh water then surrounded with more fresh water. At this stage electrical current is again reversed and the system is set for repeated cycles of freezing ice in one chamber and melting previously frozen ice in the other chamber.

In another preferred embodiment salt water is converted into fresh water by using gas circulated from a cold store to freeze ice in a continuous process. Chilled gas is circulated from the cold store 169 of FIG. 33 through a hollow rotating disk that is half immersed in a constant level bath of stirred seawater, the chilled gas returned after circulating in the hollow disk to the cold store as a closed system. Fresh water ice freezes on the chilled disk surface after which it is removed with scrapers as the disk rotates to just before re-entering the bath. The surface of ice on the disk is slightly melted by a small heater just after rotating out of the bath, the melt water running downward rinsing saltwater off the ice, leaving the remaining ice on the disk salt-free. The ice is removed from the disk before entering the brine bath again by scrapers along side the chilled disk to break the ice off the disk. The broken pieces of ice slide down a chute through a flap door to the outside of an insulated enclosure. This invention produces fresh ice and fresh ice water on a continuous basis. Ice in melt water is used to interchange heat with incoming saltwater supply pipe before entering the freezing tank thereby reducing incoming saltwater supply temperature. A controlled chilled saltwater overflow is used to chill the saltwater to be frozen in the tank wasting no more low system heat than necessary. This is done by melting the frozen ice, by heat exchange with incoming brine, thereby reusing the latent heat of fusion of the ice to draw heat from incoming brine before entering the brine freezing tank. This device can produce a thousand gallons and more of fresh water from ice-melt per day using a chiller having 62 coupons. Broken ice pieces from the disk can also be pressed into block ice for use in food storage iceboxes. This device can also be operated by mechanical refrigeration, a solid state chiller directly, or by using the cold store of FIG. 33 operated by a solid state chiller. The machine can be used to operate the saltwater-to-freshwater process on a continuous basis using a chiller 32 or 153 with or without a cold store 167 and electricity from a solar powered heat store FIG. 25.

Thus having described the method of manufacture of components, the assembly of components, an efficient means to extract energy produced by a temperature differential, a means to store and use heat in a closed system, a means to store and use a cold store in a closed system, a means to improve the overall efficiency of converting heat to electricity by combining said thermoelectric device with a chiller and by having given a variety of examples as to how to combine said thermoelectric with solid state chiller and other components to provide a broad range of useful products,

We claim:

1. A thermoelectrically powered vehicle comprising:
    a. a thermoelectric device having n-type and p-type Seebeck components that includes:
        i. a plurality of coupons soldered in registry in a circle and separated by a single insulator, each coupon comprising a metallic hot fin an adjacent p-type semiconductor, on the opposite side from the p-type semiconductor of said hot fin an n-type semiconductor and consistently adjacent to either said n-type or p-type semiconductor a metallic cold fin the components of said coupons being soldered together in the region of contact;
        ii. a means for heating said hot fins;
        iii. a make-before-brake high frequency switching means placed across said insulator to remove electrical energy generated from said circle of coupons when heat is applied to said hot fins; and
        iv. a means for holding said plurality of coupons in compression; and
    b. at least one electric motor for powering operation of said vehicle, said electric motor being:
        i. coupled to said closed circuit thermoelectric device; and
        ii. energized for driving the vehicle by electrical energy removed from said circle of coupons.

2. The thermoelectrically powered vehicle of claim 1 wherein said vehicle is retrofitted with said thermoelectric generator and said electric motor.

3. The thermoelectrically powered vehicle of claim 1 wherein said vehicle further includes a trailer that carries said thermoelectric generator and said electric motor drives wheels of said trailer.

4. The thermoelectrically powered vehicle of claim 1 wherein said vehicle further includes a trailer that carries a heat store for supplying heat to the hot fins of said thermoelectric generator.

5. The thermoelectrically powered vehicle of claim 1 wherein said thermoelectric generator includes a 3-phase output arrangement for energizing operation of said electric motor.

6. The thermoelectrically powered vehicle of claim 1 wherein said hot fins are heated by thermal energy drawn from a heat store, and
    the thermoelectrically powered vehicle further comprises:
        c. an auxiliary thermoelectric device having n-type and p-type Seebeck components that includes:
            i. a plurality of coupons soldered in registry in a circle and separated by a single insulator, each coupon comprising a metallic hot fin an adjacent p-type semiconductor, on the opposite side from the p-type semiconductor of said hot fin an n-type semiconductor and consistently adjacent to either said n-type or p-type semiconductor a metallic cold fin the components of said coupons being soldered together in the region of contact;
            ii. said hot fins are heated by burning a fuel;
            iii. a make-before-brake high frequency switching means placed across said insulator to remove electrical energy generated from said circle of coupons when heat is applied to said hot fins; and
            iv. a means for holding said plurality of coupons in compression.

* * * * *